(12) United States Patent
Sugiyama et al.

(10) Patent No.: US 7,888,760 B2
(45) Date of Patent: Feb. 15, 2011

(54) SOLID STATE IMAGING DEVICE AND METHOD FOR MANUFACTURING SAME, AND SOLID STATE IMAGING MODULE

(75) Inventors: Hitoshi Sugiyama, Kanagawa-ken (JP); Atsuko Yamashita, Kanagawa-ken (JP); Kazutaka Akiyama, Chiba-ken (JP); Susumu Harada, Kanagawa-ken (JP); Masahiro Sekiguchi, Kanagawa-ken (JP); Masayuki Dohi, Kanagawa-ken (JP); Kazumasa Tanida, Kanagawa-ken (JP); Chiaki Takubo, Tokyo (JP); Hiroshi Yoshikawa, Kanagawa-ken (JP); Akihiro Hori, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 126 days.

(21) Appl. No.: 12/249,438

(22) Filed: Oct. 10, 2008

(65) Prior Publication Data
US 2009/0096051 A1    Apr. 16, 2009

(30) Foreign Application Priority Data
Oct. 12, 2007    (JP) .............................. 2007-266734

(51) Int. Cl.
*H01L 27/146* (2006.01)
*H01L 31/0216* (2006.01)
(52) U.S. Cl. ................. 257/435; 257/433; 257/294; 257/E31.122; 257/E31.121
(58) Field of Classification Search ................. 257/435, 257/E31.12, E21.214, 433, E31.122, 294, 257/E31.121
See application file for complete search history.

(56) References Cited

U.S. PATENT DOCUMENTS

| 6,489,675 | B1 | 12/2002 | Gruber et al. | |
| 6,703,689 | B2 | 3/2004 | Wada | |
| 2003/0124773 | A1* | 7/2003 | Hashimoto | 438/127 |
| 2004/0047050 | A1* | 3/2004 | Bauer et al. | 359/738 |
| 2004/0140551 | A1* | 7/2004 | Usui et al. | 257/700 |
| 2007/0145420 | A1* | 6/2007 | Okada et al. | 257/228 |

FOREIGN PATENT DOCUMENTS

| JP | 2001-128072 | 5/2001 |
| JP | 2007-189198 | 7/2007 |

* cited by examiner

*Primary Examiner*—Ngan Ngo
*Assistant Examiner*—Benjamin Tzu-Hung Liu
(74) *Attorney, Agent, or Firm*—Oblon, Spivak, McClelland, Maier & Neustadt, L.L.P.

(57) ABSTRACT

A solid state imaging device includes: an imaging device substrate with an imaging device section formed on a first major surface side thereof; a backside interconnect electrode provided on a second major surface side of the imaging device substrate and electrically connected to the imaging device section, the second major surface being on the opposite side of the first major surface; a circuit substrate provided with a circuit substrate electrode opposed to the second major surface; a connecting portion electrically connecting the backside interconnect electrode to the circuit substrate electrode; and a light shielding layer provided coplanar with the backside interconnect electrode or on the circuit substrate side of the backside interconnect electrode.

26 Claims, 14 Drawing Sheets

SOLID STATE IMAGING DEVICE AND METHOD FOR MANUFACTURING SAME, AND SOLID STATE IMAGING MODULE

CROSS-REFERENCE TO RELATED APPLICATIONS

This application is based upon and claims the benefit of priority from the prior Japanese Patent Application No. 2007-266734, filed on Oct. 12, 2007; the entire contents of which are incorporated herein by reference.

BACKGROUND OF THE INVENTION

1. Field of the Invention

This invention relates to a solid state imaging device, such as a CMOS sensor and CCD, and a method for manufacturing the same, and a solid state imaging module.

2. Background Art

Solid state imaging devices, such as a CCD (charge coupled device) and CMOS (complementary metal oxide semiconductor) sensor, are widely used in cameras, mobile phones, and personal computers. Demand for downsizing of solid state imaging devices is increasing year by year. To this end, there have been a number of innovations, and various configurations have been proposed.

In a known structure including a solid state imaging device, an imaging device substrate provided with the solid state imaging device is placed on a circuit substrate including an external circuit, and electrodes on the imaging device substrate are connected to electrodes on the circuit substrate by wire bonding. This structure has a problem in downsizing because of the large area of the bonding region.

In response, a structure is proposed as a technique for downsizing. In this structure, a window is provided in the circuit substrate, an imaging device substrate is placed thereon so that the imaging device section is aligned with the window, and the electrodes of the imaging device substrate are connected to the electrodes of the circuit substrate by flip chip mounting (JP-A-2001-128072). This structure has the problem of light being incident on the imaging device from its backside because the backside of the imaging device substrate is exposed. To solve this problem, there is proposed a technique of providing a light shielding layer illustratively made of metal evaporated film or black resin entirely on the backside of the imaging device substrate (JP-A-2001-128072).

Recently, as a structure for further downsizing the solid state imaging device, a structure having a backside electrode has been proposed. In this structure, the imaging device substrate is provided with a penetrating electrode, for example, by which the frontside of the imaging device substrate with an imaging device formed thereon is electrically connected to the backside opposed thereto, and the interconnect of the imaging device is routed from the frontside to the backside. The imaging device substrate is placed on the circuit substrate, and a solder ball on the backside electrode of the imaging device substrate is connected to the electrode on the circuit substrate by flip chip mounting. This structure is highly expected to realize further downsizing as compared with the structure disclosed in JP-A-2001-128072. In this backside electrode structure, the circuit substrate is placed on the backside of the imaging device substrate. Hence, basically, light is not incident from the backside of the imaging device substrate. Thus, no case has been reported on the problem of backside light incidence in solid state imaging devices of the backside electrode structure.

However, according to the inventor's study, it has turned out that the problem of backside light incidence occurs also in the backside electrode structure. More specifically, in this structure, the circuit substrate is placed on the backside of the imaging device substrate. However, a solder ball having a height of several ten micrometers is interposed between these substrates, which are not in close contact with each other. Hence, light enters this small gap from the substrate periphery and reaches the backside of the imaging device section of the imaging device substrate. This causes a serious problem in the case where the imaging device is highly sensitive.

Furthermore, the height of the solder ball varies with variation in the conditions for its manufacturing process. It has thus turned out that the amount of light incident on the backside of the imaging device substrate greatly depends on the variation in the manufacturing process. Hence, this problem of backside light incidence greatly affects the yield of solid state imaging devices, and thus greatly influences the cost.

On the other hand, with regard to a solid state imaging device of the backside electrode structure, there is proposed a technique for forming a reflecting layer or antireflective film between the imaging device and the backside electrode to prevent light incident on the imaging device substrate from the frontside from being reflected at the backside and being incident on the imaging device (JP-A 2007-189198 (Kokai)).

SUMMARY OF THE INVENTION

According to an aspect of the invention, there is provided a solid state imaging device including: an imaging device substrate with an imaging device section formed on a first major surface side thereof; a backside interconnect electrode provided on a second major surface side of the imaging device substrate and electrically connected to the imaging device section, the second major surface being on the opposite side of the first major surface; a circuit substrate provided with a circuit substrate electrode opposed to the second major surface; a connecting portion electrically connecting the backside interconnect electrode to the circuit substrate electrode; and a light shielding layer provided coplanar with the backside interconnect electrode or on the circuit substrate side of the backside interconnect electrode.

According to another aspect of the invention, there is provided a method for manufacturing a solid state imaging device, including: forming a backside interconnect electrode on a second major surface side of an imaging device substrate which is provided with an imaging device section on a first major surface side thereof, the second major surface being on the opposite side of the first major surface; performing a surface treatment for hydrophobizing at least part of the surface of the backside interconnect electrode; and forming a light shielding layer on the second major surface excluding the hydrophobized portion.

According to another aspect of the invention, there is provided a solid state imaging module including: a solid state imaging device including an imaging device substrate with an imaging device section formed on a first major surface side thereof, a backside interconnect electrode provided on a second major surface side of the imaging device substrate and electrically connected to the imaging device section, the second major surface being on the opposite side of the first major surface, a circuit substrate provided with a circuit substrate electrode opposed to the second major surface, a connecting portion electrically connecting the backside interconnect electrode to the circuit substrate electrode, and a light shielding layer provided coplanar with the backside interconnect electrode or on the circuit substrate side of the backside interconnect electrode; a lens provided on the first major surface side of the solid state imaging device and opposed to the imaging device section; and a supporting component holding the lens and fixing the lens to the solid state imaging device.

DETAILED DESCRIPTION OF THE INVENTION

Embodiments of the invention will now be described in detail with reference to the drawings.

First Embodiment

Figure 1:
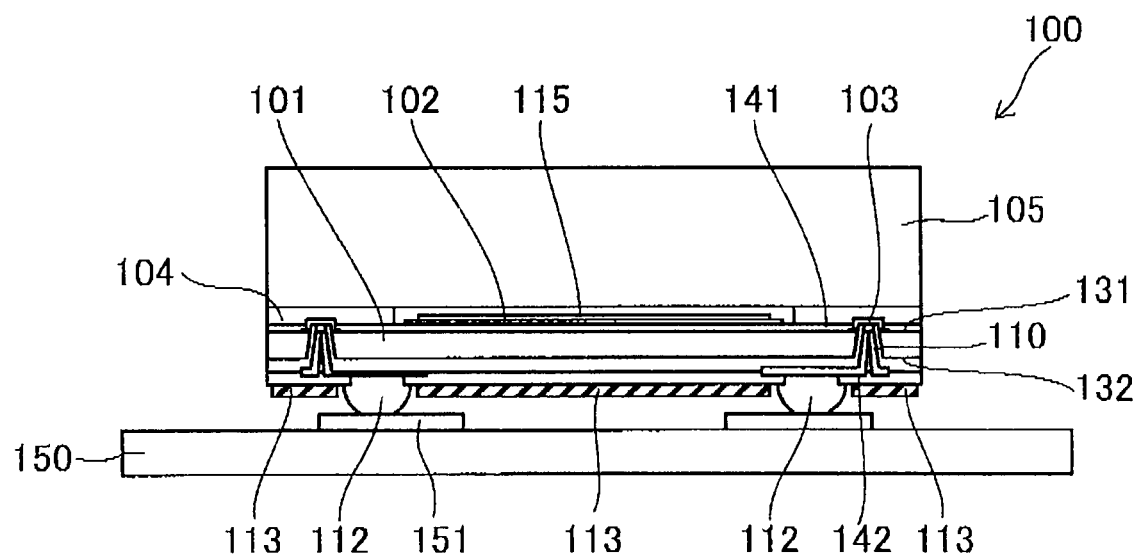
FIG. 1 is a cross-sectional schematic view illustrating the structure of a solid state imaging device according to a first embodiment of the invention.

FIG. 1 is a cross-sectional schematic view illustrating the structure of a solid state imaging device according to a first embodiment of the invention.

As shown in FIG. 1, in the solid state imaging device 100 of the first embodiment, an imaging device section 102 illustratively based on a CMOS sensor is provided on an imaging device substrate 101 made of a silicon wafer. A frontside interconnect electrode 141 is provided on the first major surface (frontside) 131 side on which the imaging device section 102 of the imaging device substrate 101 is provided. A pad 103 provided on the periphery of the imaging device substrate 101 is electrically connected to the frontside interconnect electrode 141.

A backside interconnect electrode 142 is provided on the second major surface (backside) 132 side, which is the opposite side of the frontside 131 of the imaging device substrate 101. The pad 103 is electrically connected to the backside interconnect electrode 142 by a penetrating electrode 110 passing through the imaging device substrate 101.

A connecting portion (solder ball) 112 for flip chip mounting is provided on a prescribed portion of the backside interconnect electrode 142. A circuit substrate electrode 151 is provided on a circuit substrate 150 including an external circuit. The circuit substrate electrode 151 is electrically connected to the backside interconnect electrode 142 through the solder ball 112.

Furthermore, a microlens 115 and a color filter, not shown, are provided on the surface of the imaging device section 102. A protective transparent plate 105 illustratively made of a glass substrate is provided above the microlens 115 with a gap thereto. The transparent plate 105 is bonded to the imaging device substrate 101 on the periphery of the imaging device section 102 illustratively by an adhesive 104.

The solid state imaging device 100 of this embodiment having the above-described backside electrode structure has a light shielding layer 113 on the backside 132 of the imaging device substrate 101.

For example, a light shielding layer 113 illustratively made of black resin or metal film is provided so as to cover the backside interconnect electrode 142 provided on the backside 132 or to be adjacent to the backside interconnect electrode 142 without any substantial gap.

In the foregoing, the connecting portion 112 is illustrated as a solder ball, but is not limited thereto. Any connecting portion 112 can be used as long as it serves as a means for connection between the backside interconnect electrode 142 and the circuit substrate electrode 151.

The light shielding layer 113 can be configured to substantially shield wavelengths transmitted through the imaging device substrate 101. For example, in the case where the imaging device substrate 101 is made of a silicon substrate, it is possible to use a material shielding infrared light, which is transmitted through silicon.

Figure 2:
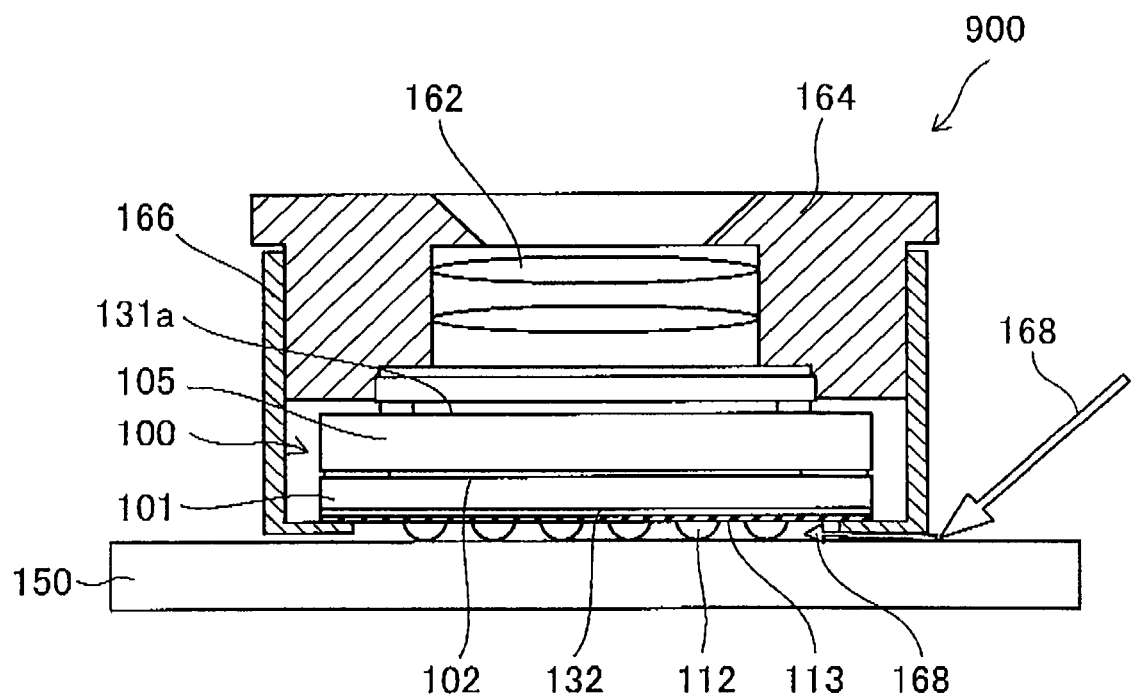
FIG. 2 is a cross-sectional schematic view illustrating the structure of a solid state imaging module based on the solid state imaging device according to the first embodiment of the invention.

FIG. 2 is a cross-sectional schematic view illustrating the structure of a solid state imaging module based on the solid state imaging device according to the first embodiment of the invention.

As shown in FIG. 2, in the solid state imaging module 900, a camera lens 162 (lens) is placed on the frontside 131a of the solid state imaging device 100. The camera lens 162 is held by a lens holder 164. The solid state imaging device 100 and the lens holder 164 are fastened by a holder 166.

More specifically, the solid state imaging module 900 comprises a solid state imaging device 100, a camera lens 162 provided on the first major surface 131a side of the solid state imaging device 100 and opposed to the imaging device section 102, and a supporting component (e.g., a lens holder 164 and a holder 166) for holding the camera lens 162 and fixing the camera lens 162 to the solid state imaging device 100.

Here, the lens holder 164 and the holder 166 can be formed in one piece. Alternatively, the shape of the holder 166 can be changed so that the holder 166 holds the camera lens 162, and the lens holder 164 can be omitted. Furthermore, for example, the camera lens 162 can be fixed to the transparent plate 105 by a spacer. In this case, this spacer serves as a supporting component.

As shown in FIG. 2, a solder ball 112 is placed on the backside 132 of the imaging device substrate 101 of the solid state imaging device 100, and the imaging device substrate 101 faces the circuit substrate 150 across the solder ball 112. The solder ball 112 has a height of several ten micrometers, and a slight gap occurs between the imaging device substrate 101 and the circuit substrate 150. Thus, a gap allowing transmission of light may occur at least in part between the above-described supporting component and the circuit substrate 150.

Light 168 is obliquely incident on this gap from outside, and this light is reflected and propagated in the gap and reaches the backside 132 of the imaging device substrate 101.

In the first embodiment of the invention, a light shielding layer 113 is provided on the backside 132. Hence, light incident from the gap does not substantially reach the imaging device section 102. This solves the problem of backside light incidence even with the backside electrode structure, and a small-sized solid state imaging device allowing uniform display can be provided at low cost.

On the other hand, in a solid state imaging device having the conventional backside electrode structure, the light that has reached the backside 132 passes through the imaging device substrate 101 and reaches the imaging device section 102. Hence, unfortunately, the shadow of the backside interconnect electrode 142 and the like provided on the backside appears as an image.

To solve this problem, for example, a member for occluding the gap between the imaging device substrate 101 and the circuit substrate 150 can be provided on the periphery of the holder 166 to block this backside incident light. However, in view of the tolerance for component dimensions and the like, it is not easy to completely block the incident light, and the cost also increases. Furthermore, the shape of the holder 166 may be designed so as to occlude the gap between the imaging device substrate 101 and the circuit substrate 150. However, this method also has difficulty in the processing accuracy for the holder 166 and other members.

From a study of the sensitivity of a solid state imaging device having the conventional backside electrode structure by allowing light to be incident thereon from the backside, a high sensitivity ratio was observed in the wavelength range of 700 to 1200 nm. Furthermore, from a study of the relationship between the visual sensitivity and the amount of light incident on the backside 132 of the imaging device substrate 101, it was found that the problem of backside light incidence can be practically avoided when the transmittance of the light shielding layer 113 is 10% or less, and more preferably 3% or less, for wavelengths from 820 to 1170 nm.

Hence, in the backside light incidence on the solid state imaging device of this embodiment, the light wavelength that may cause a problem can be restricted to 820-1170 nm, and it is advantageous that a light shielding layer 113 for attenuating light in this wavelength range is provided on the backside 132 of the imaging device substrate 101. Here, the transmittance of the light shielding layer 113 for wavelengths from 820 to 1170 nm can be 10% or less, and more preferably 3% or less.

The light shielding layer 113 can illustratively be a thin film made of various metals and metal compounds. For example, it is possible to use titanium (Ti), titanium nitride (TiN), and an aluminum-copper alloy (Al—Cu). For a thickness of 100 nm, the transmittance for wavelengths from 820 to 1170 nm is approximately 0.5% for titanium nitride, approximately 1% for titanium, and 0.1% or less for aluminum-copper alloys. In addition, the light shielding layer 113 can be made of various metals and various compounds such as metal oxides and metal nitrides, and laminated films thereof.

In another possible configuration, a conductive light shielding layer made of such a metal and metal nitride is provided on the backside of the imaging device substrate on which a backside interconnect electrode is provided via an insulating layer (that is, a configuration in which the light shielding layer is interposed between the backside interconnect electrode and the imaging device section). However, this configuration has the problem of causing image defects due to capacitive coupling between the light shielding layer and the backside interconnect electrode. Here, it is also considered to provide an insulating film thick enough to prevent the capacitive coupling. However, this is impractical because subsequent processing for fine patterns such as the penetrating electrode and the backside interconnect electrode is made difficult. Thus, the structure of providing the light shielding layer below the backside interconnect electrode via an insulating film is impractical.

In contrast, in the solid state imaging device of the first embodiment of the invention, the conductive light shielding layer is provided above the backside interconnect electrode, and hence such a problem of capacitive coupling can be avoided. That is, after completing the formation of the penetrating electrode and the backside interconnect electrode requiring microfabrication, an insulating film thick enough to prevent capacitive coupling is provided, and a conductive light shielding layer made of a metal or metal compound can be provided thereon.

The light shielding layer 113 can be made of an insulative material. More specifically, the light shielding layer 113 can be illustratively made of a light shielding resin in which carbon particles or various inorganic or organic pigment particles are mixed in polyimide or other resin, for example. In this case, for example, the light shielding resin is applied and prebaked on the substrate. Then, a photosensitive resist film is additionally provided thereon and formed into a prescribed pattern by photolithography. Subsequently, the photosensitive resist film is used as a mask to etch the light shielding resin, and the photosensitive resist film is stripped off. Then, the light shielding resin is baked. Thus, the light shielding layer 113 can be provided.

Alternatively, the light shielding layer 113 can be illustratively made of a light shielding resin in which carbon particles or various inorganic or organic pigment particles are mixed in a photosensitive acrylic resin, for example. In this case, because the light shielding resin itself is photosensitive, there is no need to additionally provide a photosensitive resist film. Thus, advantageously, the process can be simplified.

The light shielding layer 113 based on a light shielding resin can also be provided directly on the backside interconnect electrode 142. Furthermore, the light shielding layer 113 based on a light shielding resin can be provided coplanar with and adjacent to the backside interconnect electrode 142 without any substantial gap.

In the case where such a light shielding resin having insulation property is used to provide the light shielding layer 113, there is no problem of capacitive coupling. Here, the insulation property can be such that it does not exert any substantial adverse effect on the operation of the solid state imaging device.

It is also possible to consider a structure in which the light shielding layer 113 made of an insulative light shielding resin is provided below the backside interconnect electrode 142. However, in this case, in general, the surface smoothness, pattern accuracy, and contact tightness of the light shielding resin is inferior to those of the insulating film 106, the seed layer 107, and the plating layer 108, described below, used in forming the penetrating electrode 110 and the backside interconnect electrode 142. Hence, it is difficult to obtain a penetrating electrode 110 and a backside interconnect electrode 142 with high density. Thus, also in the case where the light shielding layer 113 is made of a light shielding resin, it is impractical to provide the light shielding layer 113 below the backside interconnect electrode 142.

Therefore, both in the case of using a conductive metal or metal compound, for example, and in the case of using an insulative light shielding resin, it is preferable that the light shielding layer 113 be provided above the backside interconnect electrode 142 (i.e., on the circuit substrate 150 side of the backside interconnect electrode 142), or that the light shielding layer 113 be provided coplanar with and adjacent to the backside interconnect electrode 142 without any substantial gap, rather than below the backside interconnect electrode 142.

In the case of forming the light shielding layer 113 using a light shielding resin as described above, the amount of light shielding particles contained in the light shielding resin and the film thickness can be adjusted so that the transmittance for wavelengths from 820 to 1170 nm is 10% or less, and more preferably 3% or less. In this disclosure, light having wavelengths from 820 to 1170 nm is simply referred to as "infrared light".

Furthermore, the light shielding layer 113 can be suitably placed in view of the light shielding property of the other components.

For example, in the case where the backside interconnect electrode 142 has no transmittance to infrared light, the light shielding layer 113 only needs to be provided to shield at least the gap of the backside interconnect electrode 142. In this case, the backside interconnect electrode 142 shares the function of the light shielding layer 113. In the case where the backside interconnect electrode 142 has transmittance to infrared light, the light shielding layer 113 can be provided to entirely cover the backside interconnect electrode 142. Here, in accordance with the infrared light transmittance of the backside interconnect electrode 142, the transmittance for wavelengths from 820 to 1170 nm can be more than 10% as long as the infrared light transmittance of the light shielding layer 113 does not cause any practical problem. That is, in combination with various components on the backside 132 of the imaging device substrate 101 such as the backside interconnect electrode 142, the light shielding layer 113 only needs to satisfy the condition in which light incident on the imaging device section 102 from the backside 132 is practically shielded. In the case where a film for shielding or attenuating infrared light is provided between the backside 132 of the imaging device substrate 101 and the imaging device section 102, the characteristic of the light shielding layer 113 is not limited to the above-described range as long as, in combination with the film, the light shielding layer 113 can practically shield infrared light incident on the imaging device section 102 from the backside 132.

Furthermore, the light shielding layer 113 can be suitably placed in view of electrical connection to the other components.

More specifically, in the case where the light shielding layer 113 is insulative, the light shielding layer 113 can be in direct contact with the backside interconnect electrode 142 and the solder ball 112. In the case where the light shielding layer 113 is conductive, the light shielding layer 113 can be spaced from the backside interconnect electrode 142 and the solder ball 112, or provided adjacent thereto via an additional insulating layer.

Furthermore, the light shielding layer 113 can be provided while retaining electrical conductivity between the solder ball 112 and the backside interconnect electrode 142.

Moreover, because the backside interconnect electrode 142 is electrically connected to the circuit substrate electrode 151 on the circuit substrate 150 by the solder ball 112, the light shielding layer 113 can be provided while retaining the electrical conductivity of at least part of the surface of the solder ball 112 on the circuit substrate 150 side. That is, the light shielding layer 113 is provided so as to expose at least part of the solder ball (connecting portion) 112.

Thus, because the solid state imaging device of the first embodiment of the invention has a backside electrode structure, the light shielding layer 113 can be suitably placed in view of at least the light shielding property and conductivity in relation to the other members.

First Example

In the following, a first example according to the first embodiment of the Invention is described.

Figure 3:
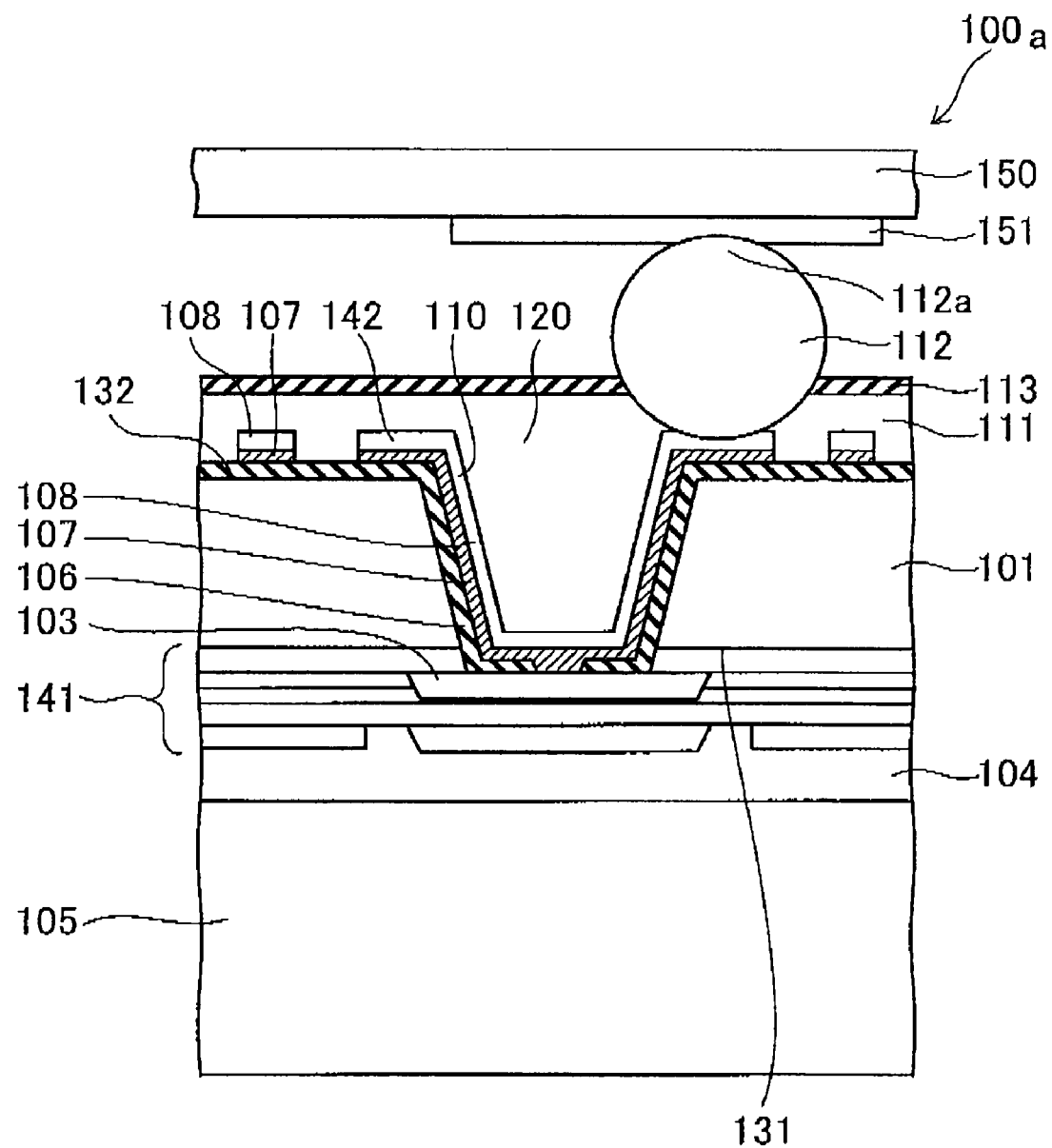
FIG. 3 is a cross-sectional schematic view showing the structure of a solid state imaging device of a first example of the invention.

FIG. 3 is a cross-sectional schematic view showing the structure of a solid state imaging device of the first example of the invention.

More specifically, FIG. 3 is a partial cross-sectional view of the peripheral region of the imaging device section 102 of the solid state imaging device of the first example. The imaging device section 102 is placed illustratively to the right of FIG. 3. It is noted that the solid state imaging device shown in FIG. 1 is shown upside down in FIG. 3.

As shown in FIG. 3, in the solid state imaging device 100a of the first example, a frontside interconnect electrode 141 illustratively made of a laminated interconnect is provided on the frontside 131 of the imaging device substrate 101 made of a silicon wafer. Furthermore, a pad 103 electrically connected to the frontside interconnect electrode 141 is provided on the frontside 131. Moreover, an imaging device section 102 (not shown) illustratively made of a CMOS sensor is provided on the frontside 131.

A backside interconnect electrode 142 is provided on the backside 132 of the imaging device substrate 101. The pad 103 is electrically connected to the backside interconnect electrode 142 by a penetrating electrode 110 passing through the imaging device substrate 101. The penetrating electrode 110 is configured so that, in a via hole 120 provided in the imaging device substrate 101, an insulating film 106 provided on the imaging device substrate 101 is laminated with a seed layer 107 and a plating layer 108 provided on the insulating film 106.

A solder ball 112 for flip chip mounting is provided on a prescribed portion of the backside interconnect electrode 142. The solder ball 112 is electrically connected to the circuit substrate electrode 151 of a circuit substrate 150.

A solder resist 111 is provided on the backside 132 excluding its portion corresponding to the solder ball 112, and a light shielding layer 113 is provided on the upper surface of the solder resist 111. The light shielding layer 113 is provided excluding a site 112a of the solder ball 112 being in contact with the circuit substrate electrode 151, allowing electrical connection to be maintained between the solder ball 112 and the circuit substrate electrode 151. The light shielding layer 113 has a transmittance of 10% or less for wavelengths from 820 to 1170 nm and is illustratively made of a photosensitive acrylic resin containing carbon particles.

A protective transparent plate 105 illustratively made of a glass substrate is provided on the frontside interconnect electrode 141 on the frontside 131, and bonded to the imaging device substrate 101 illustratively by an adhesive 104. Furthermore, a microlens and a color filter are provided on the imaging device section 102, not shown, on the frontside 131. The transparent plate 105 is spaced from the microlens and the color filter.

In the following, a method for manufacturing the solid state imaging device of the first example of the invention is described.

FIGS. 4A to 4F and 5A to 5E are cross-sectional schematic views in each step of manufacturing the solid state imaging device of the first example of the invention.

Figure 4A:
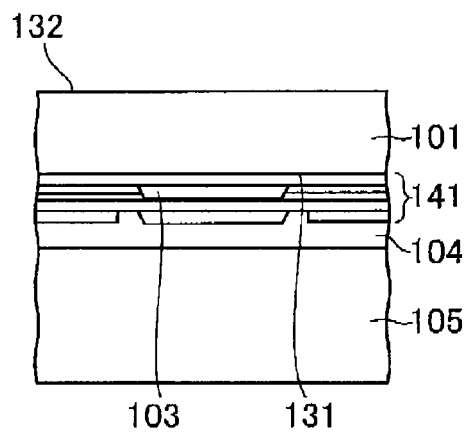
FIGS. 4A to 4F are cross-sectional schematic views in each step of manufacturing the solid state imaging device of the first example of the invention.

First, by conventional methods, an imaging device section 102, not shown, a frontside interconnect electrode 141, and a pad 103 are formed on the frontside 131 of an imaging device substrate 101 illustratively made of a silicon wafer having a thickness of 100 μm, and a protective transparent plate 105 illustratively made of a glass substrate is bonded to the frontside 131 of the imaging device substrate 101 illustratively by an adhesive 104. Thus, a laminated structure of the imaging device substrate 101 and the transparent plate 105 is obtained as shown in FIG. 4A. It is noted that FIGS. 4A to 4F and 5A to 5E show the peripheral portion of the imaging device section 102 of the solid state imaging device. The imaging device section 102 is provided illustratively to the right of these figures.

Figure 4B:
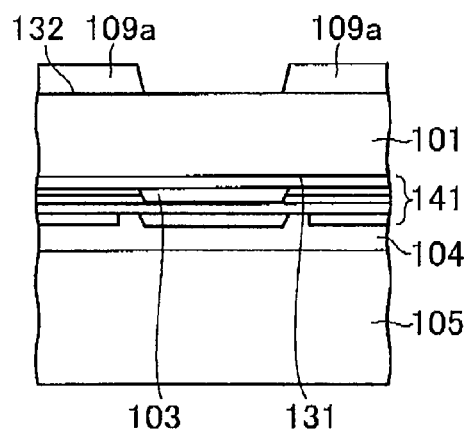

Next, as shown in FIG. 4B, a resist 109a having a prescribed pattern is provided on the backside 132 of the imaging device substrate 101 by photolithography.

Figure 4C:
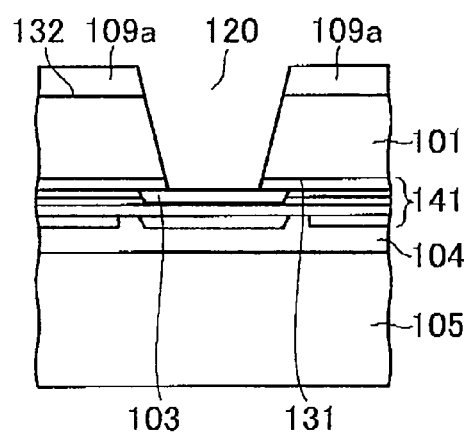

Subsequently, as shown in FIG. 4C, the resist 109a is used as a mask to etch the imaging device substrate 101 illustratively by RIE (reactive ion etching) to form a via hole 120. Then, the resist 109a is stripped off.

Figure 4D:
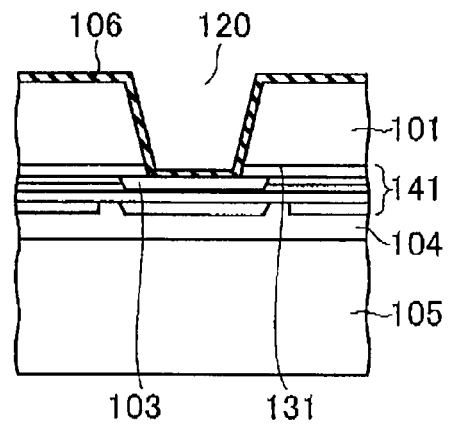

Next, as shown in FIG. 4D, a silicon oxide film, for example, is formed by CVD (chemical vapor deposition) to provide an insulating film 106.

Figure 4E:
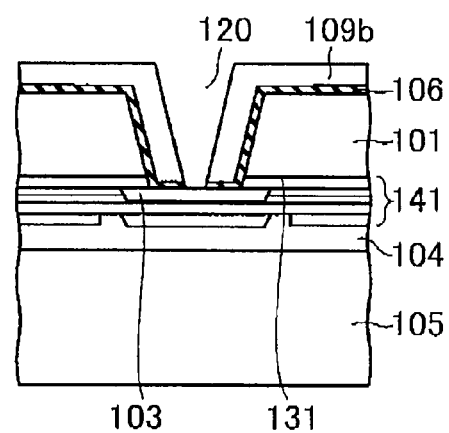

Next, as shown in FIG. 4E, a resist 109b having a prescribed pattern is provided on the insulating film 106, and the resist 109b is used as a mask to etch the insulating film 106 to the pad 103. Then, the resist 109b is stripped off.

Figure 4F:
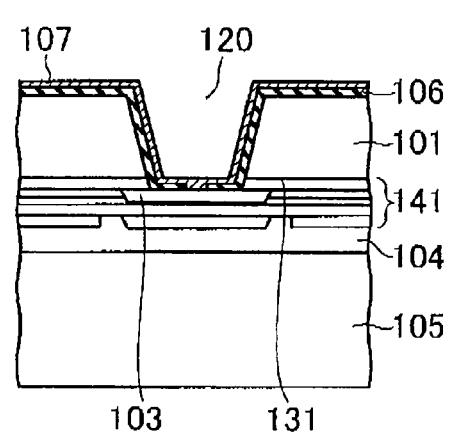

Next, as shown in FIG. 4F, a seed layer 107 illustratively made of CuTi is provided by sputtering on the Insulating film 106 and the exposed pad 103.

Figure 5A:
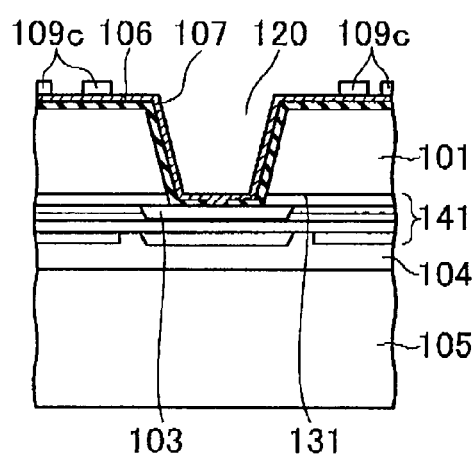
FIGS. 5A to 5E are cross-sectional schematic views following after FIG. 4F.

Next, as shown in FIG. 5A, a resist 109c for forming a copper plating pattern is provided on the seed layer 107 by photolithography.

Figure 5D:
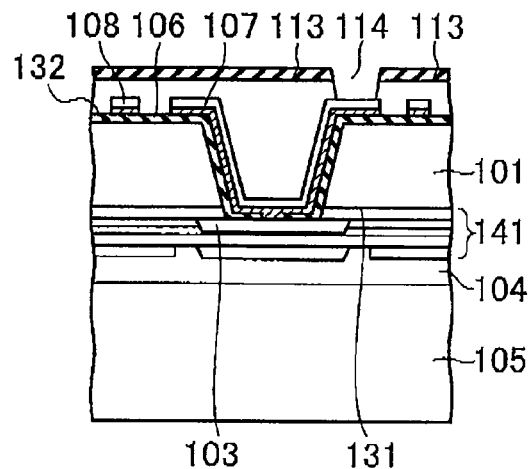
Figure 5B:
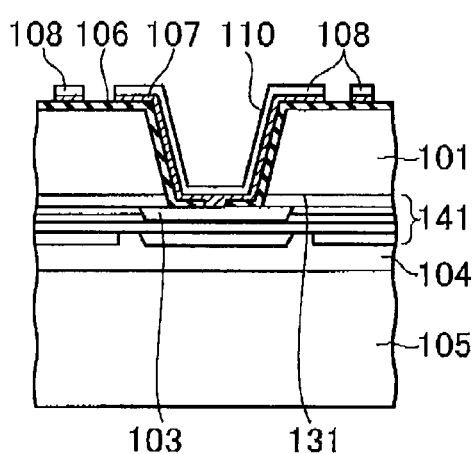

Next, as shown in FIG. 5B, the resist 109c is used as a mask to selectively provide a plating layer 108 made of copper on the seed layer 107 by plating. Subsequently, the resist 109c is stripped off. The seed layer 107 and the plating layer 108 thus formed serve as a penetrating electrode 110 and a backside interconnect electrode 142.

Figure 5E:
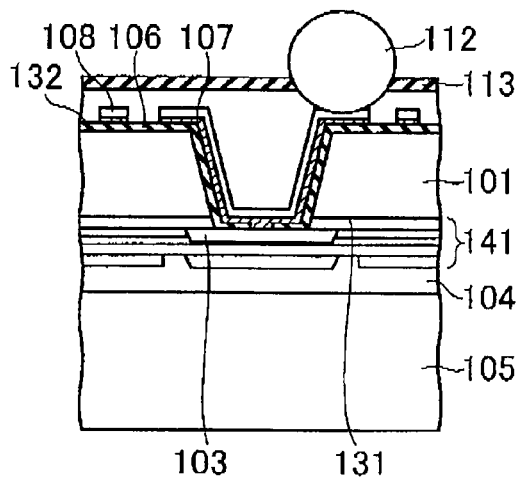
Figure 5C:
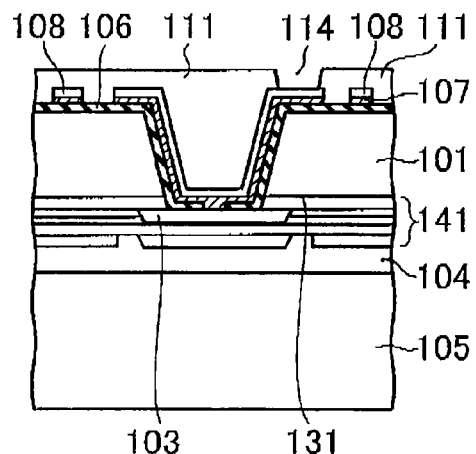

Next, as shown in FIG. 5C, a solder resist liquid is provided on the insulating film 106, the seed layer 107, and the plating layer 108 by spincoating, and then photolithography is used to provide a solder resist 111 excluding the ball opening 114.

Next, as shown in FIG. 5D, a light shielding layer 113 is provided on the solder resist 111 excluding the ball opening 114 by photolithography. The light shielding layer 113 is configured so that its transmittance for wavelengths from 820 to 1170 nm is 10% or less.

It is noted that at least the backside interconnect electrode 142 is disposed at the bottom of the ball opening 114, and a solder ball 112 is placed therein later. Hence, even if the light shielding layer 113 is not provided in the ball opening 114, light cannot be incident from the backside.

The light shielding layer 113 can be formed illustratively by applying a photosensitive resin (e.g., photosensitive acrylic resin) containing carbon particles, followed by exposure and development using a prescribed mask.

Alternatively, the light shielding layer 113 can be made of a non-photosensitive resin (e.g., polyimide resin). In this case, another resist is formed thereon and used for processing into a prescribed pattern. The resin to serve as a light shielding layer 113 can be provided as a resin solution on the imaging device substrate 101 by the spinner method, the ink jet method, or the dispenser method. The ink jet method and the dispenser method allow not only application of a resin solution, but also formation of a light shielding layer 113 into a prescribed pattern (e.g., the pattern excluding the ball opening 114) without using the steps of exposure and development. Alternatively, the dry film method can also be used to provide the light shielding layer 113. With regard to the developer for processing the light shielding layer 113, an alkaline developer such as TMAH (tetramethylammonium hydroxide) and a solvent such as NMP (N-methyl-2-pyrrolidone) can be used.

In the resin used for the light shielding layer 113, besides carbon particles, various inorganic and organic pigment particles or mixtures thereof can be contained.

Subsequently, as shown in FIG. 5E, a solder ball 112 is provided in the ball opening 114. Thus, the light shielding layer 113 can be provided so that the site 112a of the solder ball 112 being in contact with the circuit substrate electrode 151 is exposed to the backside 132 of the imaging device substrate 101 (see FIG. 3).

Subsequently, by conventional methods, the circuit substrate 150 is opposed to the imaging device substrate 101, and the solder ball 112 is electrically connected to the circuit substrate electrode 151 on the circuit substrate 150. As described above, the light shielding layer 113 is provided excluding the site 112a of the solder ball 112 being in contact with the circuit substrate electrode 151, hence allowing electrical connection to be maintained between the solder ball 112 and the circuit substrate electrode 151.

Thus, the solid state imaging device 100a of the first example shown in FIG. 3 is obtained.

In the solid state imaging device 100a of the first example thus fabricated, a light shielding layer 113 having a transmittance of 10% or less for wavelengths from 820 to 1170 nm is provided on the backside 132 of the imaging device substrate 101 so that the backside incident light can be shielded. Hence, a small-sized solid state imaging device having a backside electrode structure and allowing uniform display can be provided at low cost.

Second Example

Next, a second example of the invention is described.

Figure 6:
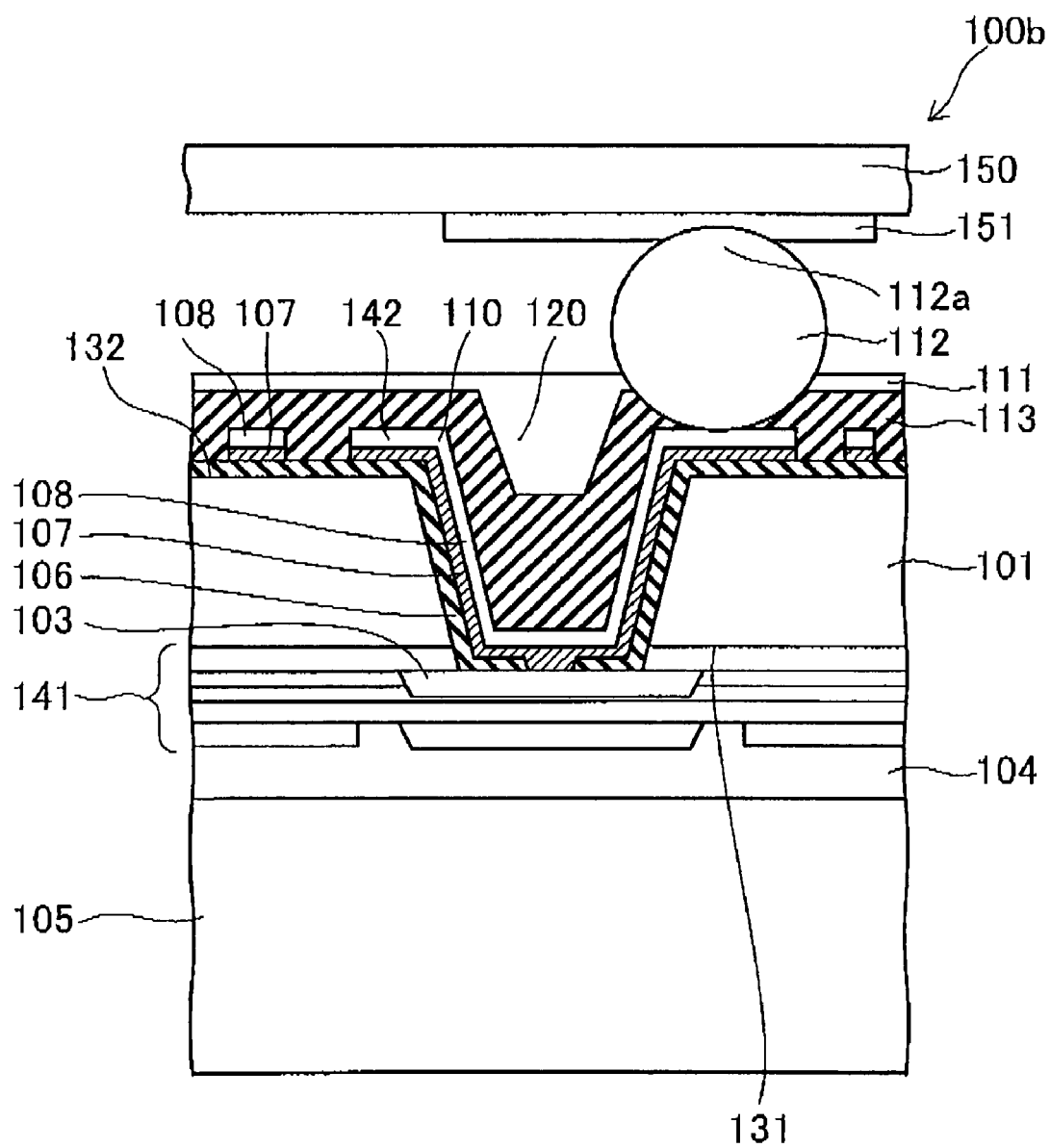
FIG. 6 is a cross-sectional schematic view showing the structure of a solid state imaging device of a second example of the invention.

FIG. 6 is a cross-sectional schematic view showing the structure of a solid state imaging device of the second example of the invention.

The solid state imaging device 100b of the second example has a structure in which the order of forming the solder resist 111 and the light shielding layer 113 in the solid state imaging device of the first example is reversed.

More specifically, as shown in FIG. 6, a light shielding layer 113 is provided on a region of the backside 132 excluding the portion corresponding to the solder ball 112, and a solder resist 111 is provided on the light shielding layer 113.

In the following, a method for manufacturing the solid state imaging device of the second example is described.

FIGS. 7A to 7D are cross-sectional schematic views in each step of manufacturing the solid state imaging device of the second example.

In FIG. 7, the steps until forming a via hole 120, an insulating film 106, a seed layer 107, and a plating layer 108 to provide a penetrating electrode 110 are the same as those in FIGS. 4A to 4F, 5A, and 5B of the first example. Hence, FIG. 7 omits them and shows the process subsequent thereto. An imaging device substrate 101 having an imaging device section 102, a frontside interconnect electrode 141, and a pad 103 is laminated with a transparent plate 105. In this structure, a via hole 120, an insulating film 106, a seed layer 107, and a plating layer 108 are formed to provide a penetrating electrode 110. Then, as shown in FIG. 7A, a light shielding layer 113 is provided on the Insulating film 106, the seed layer 107, and the plating layer 108. The light shielding layer 113 is configured so that its transmittance for wavelengths from 820 to 1170 nm is 10% or less. The light shielding layer 113 is formed illustratively by applying a resin (e.g., non-photosensitive, polyimide resin) containing carbon particles or color pigments described in the first example.

Figure 7A:
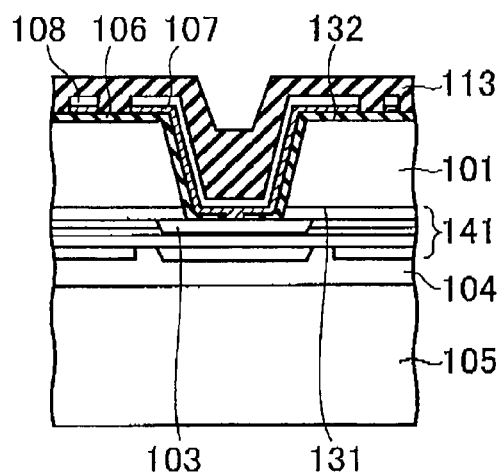
FIGS. 7A to 7D are cross-sectional schematic views in each step of manufacturing the solid state imaging device of the second example.
Figure 7B:
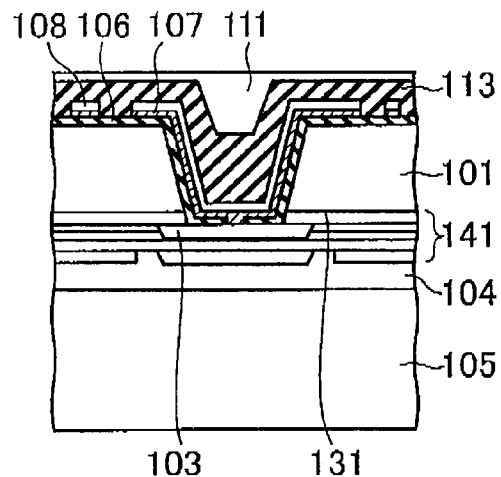

Next, as shown in FIG. 7B, a solder resist 111 is applied onto the light shielding layer 113.

Figure 7C:
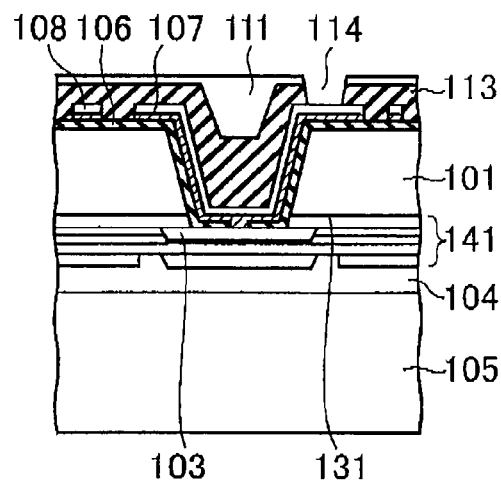

Subsequently, as shown in FIG. 7C, a prescribed mask is used to perform exposure and development on the solder resist 111, and simultaneously, the light shielding layer 113 is dissolved. This results in forming a solder resist 111 having a ball opening 114. Thus, in the second example, even if the light shielding layer 113 is made of a non-photosensitive resin, the light shielding layer 113 can be dissolved simultaneously with the development of the solder resist. This allows cost reduction by decreasing the number of process steps.

In the case where the light shielding layer 113 is made of a photosensitive resin, it is also possible to perform exposure and development on the light shielding layer 113 independent of exposure and development on the solder resist 111. Furthermore, suitable selection of materials may allow the light shielding layer 113 and the solder resist 111 to be simultaneously subjected to exposure and development.

It is noted that at least the backside interconnect electrode 142 is disposed at the bottom of the ball opening 114, and a solder ball 112 is placed therein later. Hence, even if the light shielding layer 113 is not provided in the ball opening 114, light cannot be incident from the backside.

Figure 7D:
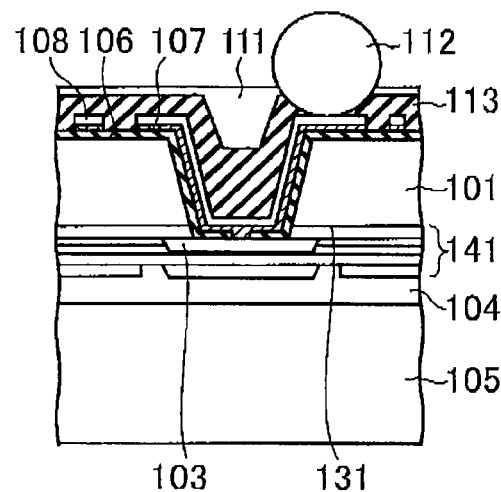

Subsequently, as shown in FIG. 7D, a solder ball 112 is provided in the ball opening 114. Thus, the light shielding layer 113 can be provided so that the site 112a of the solder ball 112 being in contact with the circuit substrate electrode 151 is exposed to the backside 132 of the imaging device substrate 101 (see FIG. 6).

Subsequently, like the first example, the circuit substrate 150 and the imaging device substrate 101 are assembled to obtain the solid state imaging device 100b of the second example shown in FIG. 6. As described above, the light shielding layer 113 is provided excluding the site 112a of the solder ball 112 being in contact with the circuit substrate electrode 151, hence allowing electrical connection to be maintained between the solder ball 112 and the circuit substrate electrode 151.

The solid state imaging device 100b of the second example thus fabricated is small because of its backside electrode structure, and can shield backside incident light while maintaining electrical connection by the solder ball. Thus, a small-sized solid state imaging device allowing uniform display can be provided at low cost.

Third Example

Next, a third example of the invention is described.

Figure 8:
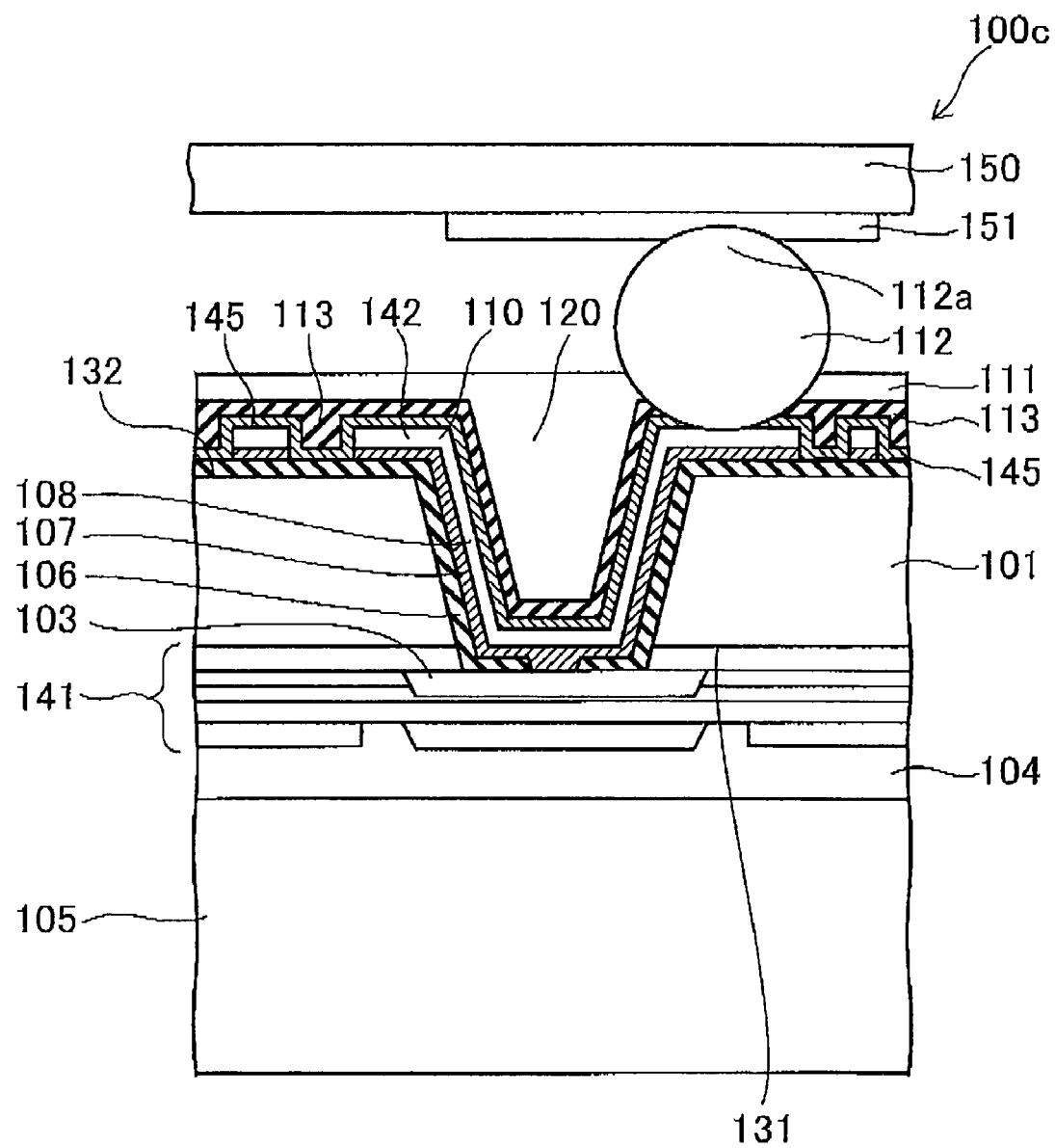
FIG. 8 is a cross-sectional schematic view showing the structure of a solid state imaging device of a third example of the invention.

FIG. 8 is a cross-sectional schematic view showing the structure of a solid state imaging device of the third example of the invention.

The solid state imaging device 100c of the third example is different from the solid state imaging device of the first example in that the light shielding layer 113 is provided above the backside interconnect electrode 142 via an insulating layer.

More specifically, as shown in FIG. 8, an insulating film 106, a seed layer 107, and a plating layer 108 are provided on the imaging device substrate 101. Furthermore, a light shielding layer 113 and a solder resist 111 are provided thereabove via an insulating layer 145, and a solder ball 112 is provided thereon. The light shielding layer 113 in this structure can be made of a conductive material such as a metal and metal compound, besides a light shielding resin.

In the following, a method for manufacturing the solid state imaging device of the third example is described.

FIGS. 9A to 9F are cross-sectional schematic views in each step of manufacturing the solid state imaging device of the third example.

In FIG. 9, the steps until forming a via hole 120, an insulating film 106, a seed layer 107, and a plating layer 108 to provide a penetrating electrode 110 are the same as those in FIGS. 4A to 4F, 5A, and 5B of the first example. Hence, FIG. 7 omits them and shows the process subsequent thereto. An imaging device substrate 101 having an imaging device section 102, a frontside interconnect electrode 141, and a pad 103 is laminated with a transparent plate 105. In this structure, a via hole 120, an insulating film 106, a seed layer 107, and a plating layer 108 are formed to provide a penetrating electrode 110. Then, as shown in FIG. 9A, an insulating layer 145 is provided on the insulating film 106, the seed layer 107, and the plating layer 108. The insulating layer 145 can be made of an inorganic material such as silicon oxide and silicon nitride illustratively provided by CVD. Alternatively, the insulating layer 145 can be made of an organic material such as acrylic resin and polyimide resin.

Figure 9A:
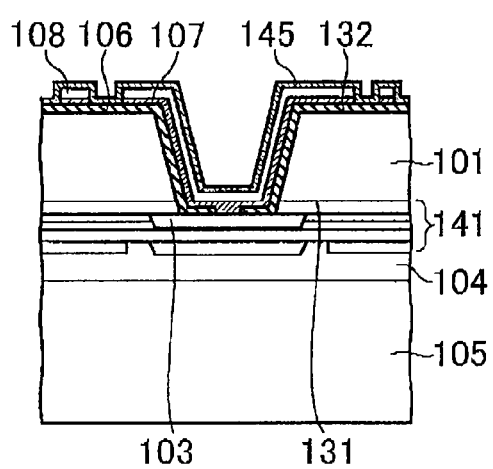
FIGS. 9A to 9F are cross-sectional schematic views in each step of manufacturing the solid state imaging device of the third example.
Figure 9D:
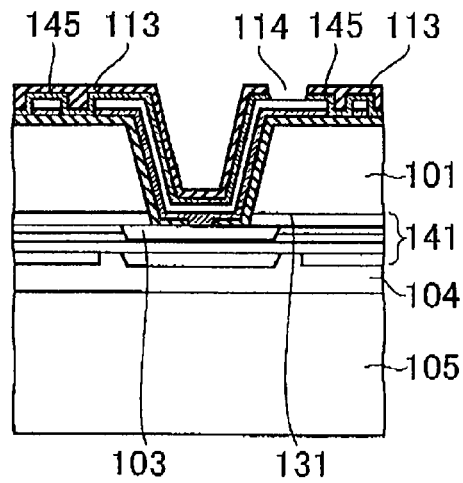
Figure 9B:
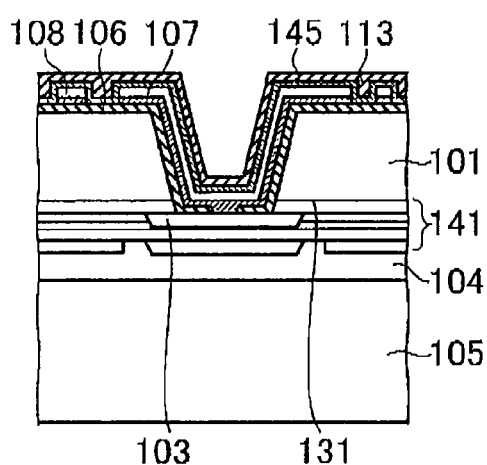

Subsequently, as shown in FIG. 9B, a metal film illustratively made of titanium (Ti) is provided as a light shielding layer 113 on the insulating layer 145 by sputtering. Besides titanium (Ti), this light shielding layer 113 can be made of a metal such as aluminum (Al) and tungsten (W), as well as a metal compound such as titanium nitride (TiN) and aluminum-copper (Al—Cu). The film thickness can be 10 to 100 nm for titanium.

Figure 9E:
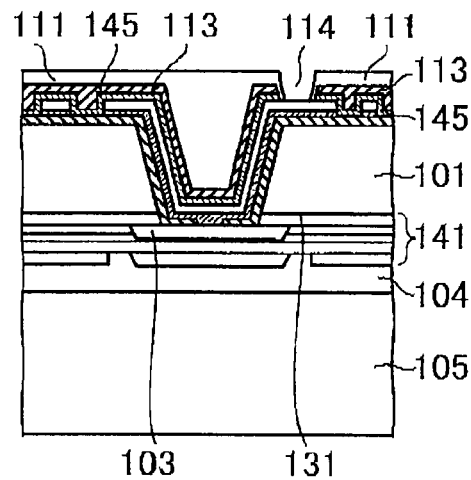
Figure 9C:
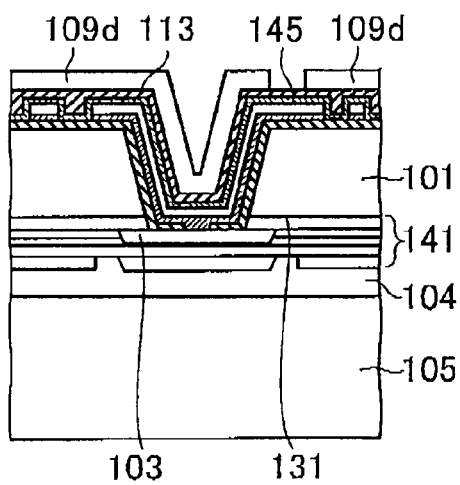

Next, as shown in FIG. 9C, a resist 109d is formed on the light shielding layer 113 by photolithography.

Subsequently, as shown in FIG. 9D, the resist 109d is used as a mask to etch the insulating layer 145 together with the light shielding layer 113 to form the light shielding layer 113 and the insulating layer 145 into a prescribed pattern excluding a ball opening 114.

Subsequently, as shown in FIG. 9E, a solder resist 111 is provided excluding the ball opening 114.

Figure 9F:
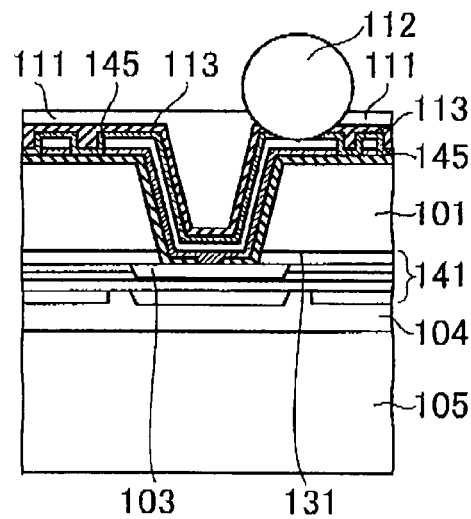

Subsequently, as shown in FIG. 9F, a solder ball 112 is placed in the ball opening 114. Like the first example, the circuit substrate 150 and the imaging device substrate 101 are assembled to obtain the solid state imaging device 100c of the third example shown in FIG. 8. Here, as shown in FIG. 8, the light shielding layer 113 is provided above the backside interconnect electrode 142 via the insulating layer 145, and hence electrically isolated from the backside interconnect electrode 142 and the penetrating electrode 110 (the seed layer 107 and the plating layer 108). Furthermore, the light shielding layer 113 is electrically isolated from the solder ball 112 by the solder resist 111. Thus, in the structure like the third example in which the light shielding layer 113 is provided above the backside interconnect electrode 142 via the insulating layer 145, the light shielding layer 113 can be made of a conductive material.

The solid state imaging device 100c of the third example thus fabricated is small because of its backside electrode structure, and can shield backside incident light while maintaining electrical connection by the solder ball. Thus, a small-sized solid state imaging device allowing uniform display can be provided at low cost.

Fourth Example

Next, a fourth example of the invention is described.

The fourth example has a similar configuration to the first example shown in FIG. 3. More specifically, a backside interconnect electrode 142 is placed on the backside 132 of the imaging device substrate 101, a solder resist 111 is provided thereon, and a light shielding layer 113 is provided thereon excluding the site 112a of the solder ball 112 being in contact with the circuit substrate electrode 151. The fourth example described below is different from the first example in the method for forming the light shielding layer 113

Figure 10:
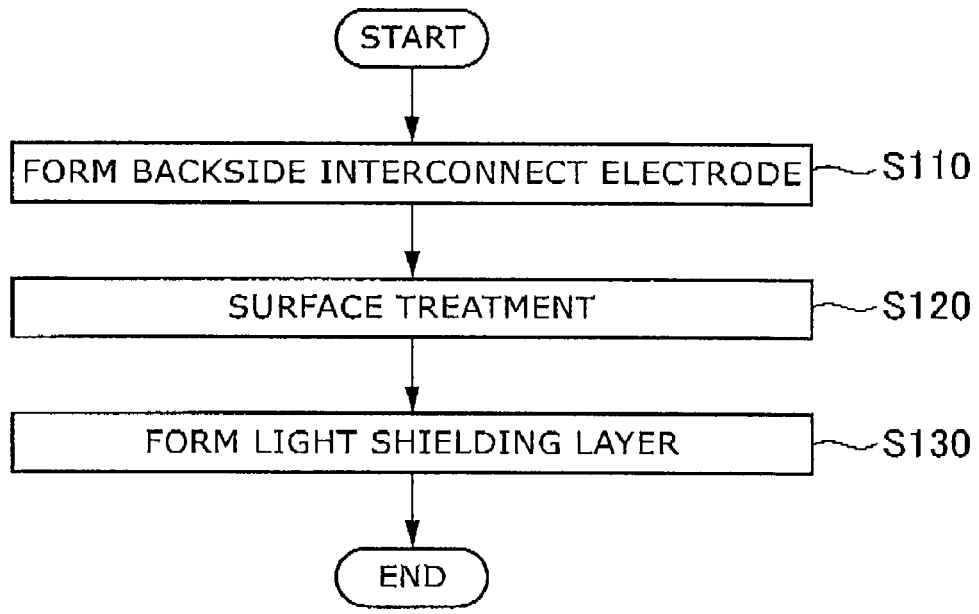
FIG. 10 is a flow chart illustrating a method for manufacturing a solid state imaging device of a fourth example of the invention.

FIG. 10 is a flow chart illustrating a method for manufacturing a solid state imaging device of the fourth example of the invention.

As shown in FIG. 10, in the method for manufacturing a solid state imaging device of the fourth example, first, a backside interconnect electrode 142 is formed in S110. This backside interconnect electrode 142 can be the plating layer 108 in the solid state imaging device of the first example. For example, it can be a Cu film formed by plating. The Cu film can include a seed layer.

Subsequently, in S120, the backside 132 of the imaging device substrate 101 is subjected to surface treatment. For example, it is treated with an OSP (organic soldering preservative). By this OSP treatment, the surface energy of the surface of the backside interconnect electrode 142 can be made different from the surface energy of the portion other than the backside interconnect electrode 142. That is, only the surface portion of the backside interconnect electrode 142 can be turned into a hydrophobic surface, and the other portion can be turned into a hydrophilic surface.

Subsequently, in S130, for example, a light shielding resin containing carbon particles or various inorganic or organic pigment particles is applied. Because the surface of the backside interconnect electrode 142 is hydrophobized, this portion is not coated with the light shielding resin, and the portion other than the backside interconnect electrode 142 is coated with the light shielding resin. Subsequently, the light shielding resin is cured.

Thus, the light shielding layer 113 can be selectively provided.

A more detailed description is given below.

Figure 11:
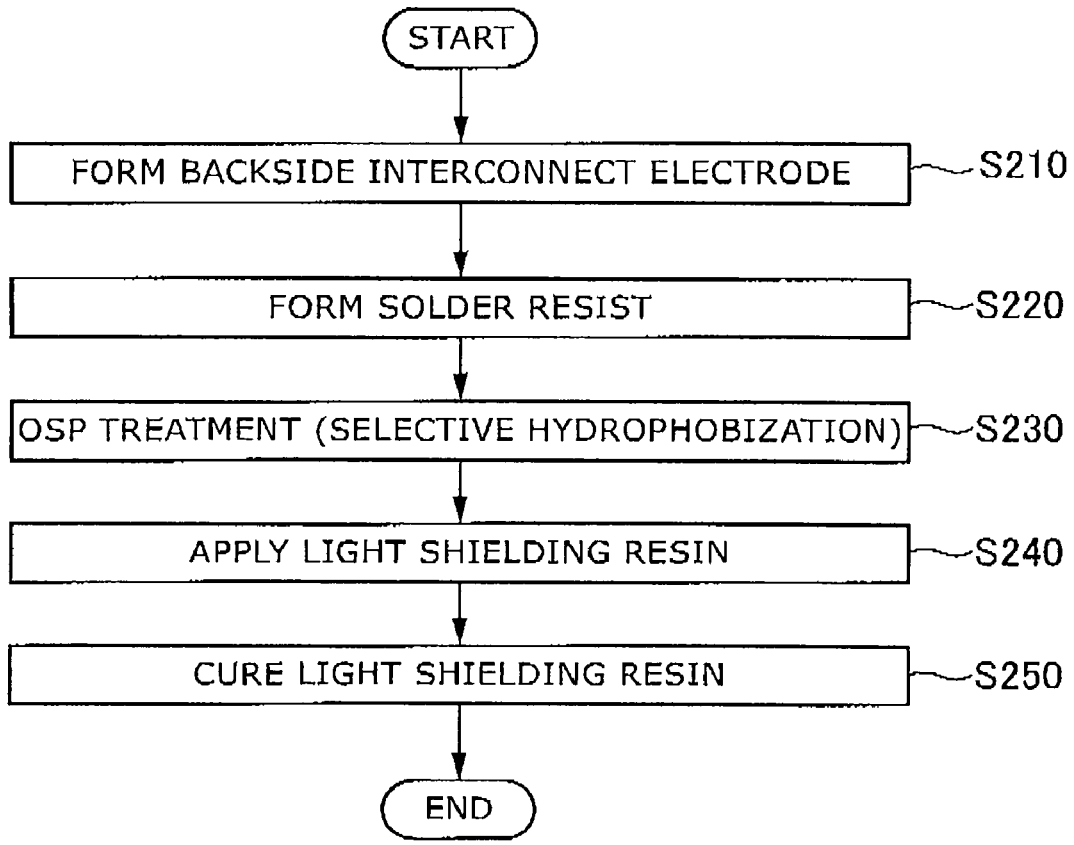
FIG. 11 is a flow chart illustrating a method for manufacturing a solid state imaging device of the fourth example of the invention.

FIGS. 11 and 12 are a flow chart and a process cross-sectional view illustrating a method for manufacturing a solid state imaging device of the fourth example of the invention.

Figure 12A:
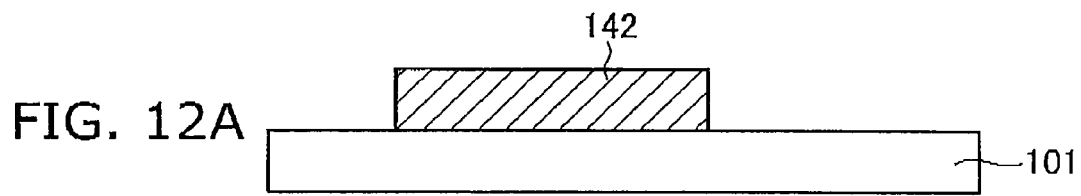
FIGS. 12A to 12E are process cross-sectional views illustrating a method for manufacturing a solid state imaging device of the fourth example of the invention.

As shown in FIG. 11, first, a backside interconnect electrode 142 is formed in S210 (see FIG. 12A, where the other members are not shown). In this step, for example, the method described above with reference to FIGS. 4A to 4F, 5A, and 5B can be used.

Figure 12B:
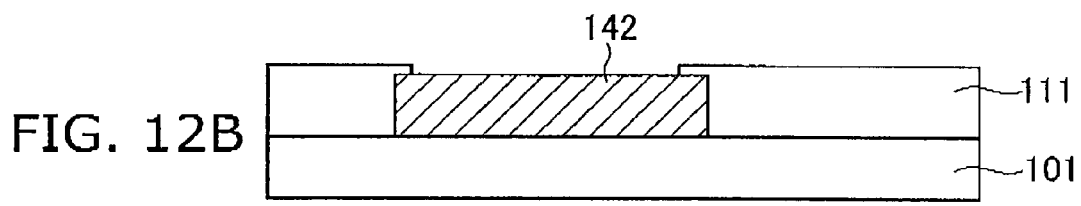

Next, in S220, a solder resist 111 is formed (see FIG. 12B). In this step, the method described with reference to FIG. 5C can be illustratively used. Here, the solder resist 111 is provided excluding a ball opening 114.

Figure 12C:
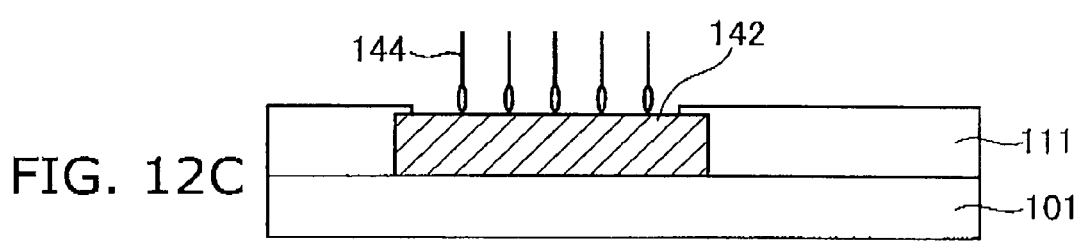

Next, in S230, the OSP treatment is performed as a surface treatment (see FIG. 12C). Specifically, the treatment illustrated below is performed. The OSP can illustratively be a solution containing an imidazole compound, Cu ions, and an organic acid. The imaging device substrate 101 is immersed in this OSP solution and washed. Thus, an organic coating 144 is formed only on the surface of the Cu film 108 (backside interconnect electrode 142) on the backside 132 of the imaging device substrate 101 (see FIG. 12C). That is, an organic coating 144 is formed only on the surface portion of the ball opening 114 formed by the Cu film 108. The organic coating 144 serves to hydrophobize the surface. This realizes a surface treatment for selectively hydrophobizing only the surface of the Cu film 108 exposed from the solder resist 111. In the foregoing, the OSP is illustratively a solution containing an imidazole compound, Cu ions, and an organic acid. However, the OSP is not limited thereto, but can be anything as long as it has an effect of selectively hydrophobizing a region of the backside interconnect electrode 142 corresponding to the ball opening 114. That is, the OSP can be suitably selected depending on the surface property of the material (and the other portion) constituting the surface of the ball opening 114 of the backside interconnect electrode 142. Furthermore, the method of OSP treatment for the imaging device substrate 101 is not limited to the above immersion method, but various methods such as printing and spincoating can be used.

Figure 12D:
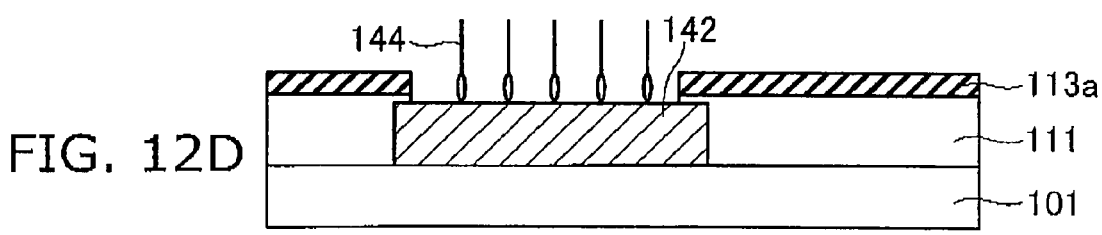
Figure 12E:
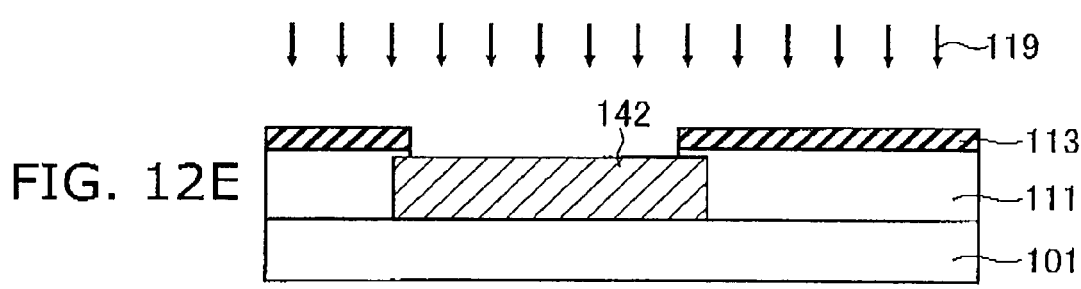

Next, in S240, a light shielding resin 113a is applied (FIG. 12D). Here, because the surface of the Cu film 108 (backside interconnect electrode 142) is hydrophobized, the light shielding resin 113a is repelled and not attached thereto, but attached only to the other portion.

Next, in S250, the light shielding resin 113a is cured. For example, in the case where the light shielding resin is ultraviolet curable, the light shielding resin 113a is cured by irradiation with ultraviolet light 119 to form a light shielding layer 113 (see FIG. 12E). After ultraviolet Irradiation, the step of heat curing can be additionally performed. In the case where the light shielding resin 113a is heat curable, such as polyimide resin, rather than ultraviolet curable, then heating is performed instead of irradiation with ultraviolet light 119. Thus, a light shielding layer 113 can be selectively provided on the portion excluding the ball opening 114.

Subsequently, the backside 132 of the imaging device substrate 101 can be irradiated with ultraviolet light to hydrophilize the surface of the Cu film 108 (ball opening 114), which was once hydrophobized. That is, ultraviolet light can be used to remove the organic coating 144 or deactivate the hydrophobization effect of the organic coating 144. This facilitates the subsequent step of placing the solder ball 112, for example, and further ensures electrical connection between the Cu film 108 and the solder ball 112. In the foregoing, in the case where the light shielding layer is made of a photosensitive resin, the organic coating 144 for hydrophobization can be hydrophilized by ultraviolet irradiation for curing the photosensitive resin, and the number of process steps can be reduced. Besides ultraviolet irradiation, the above hydrophilization of the organic coating 144 can be also realized illustratively by plasma ashing.

Subsequently, the solid state imaging device is fabricated in a similar method to the first example.

In the solid state imaging device thus obtained, the light shielding layer 113 can be easily and selectively provided on the backside of the imaging device substrate 101. Thus, a small-sized solid state imaging device having a backside electrode structure and allowing uniform display can be provided at low cost.

Fifth Example

Next, a fifth example of the invention is described.

Figure 13:
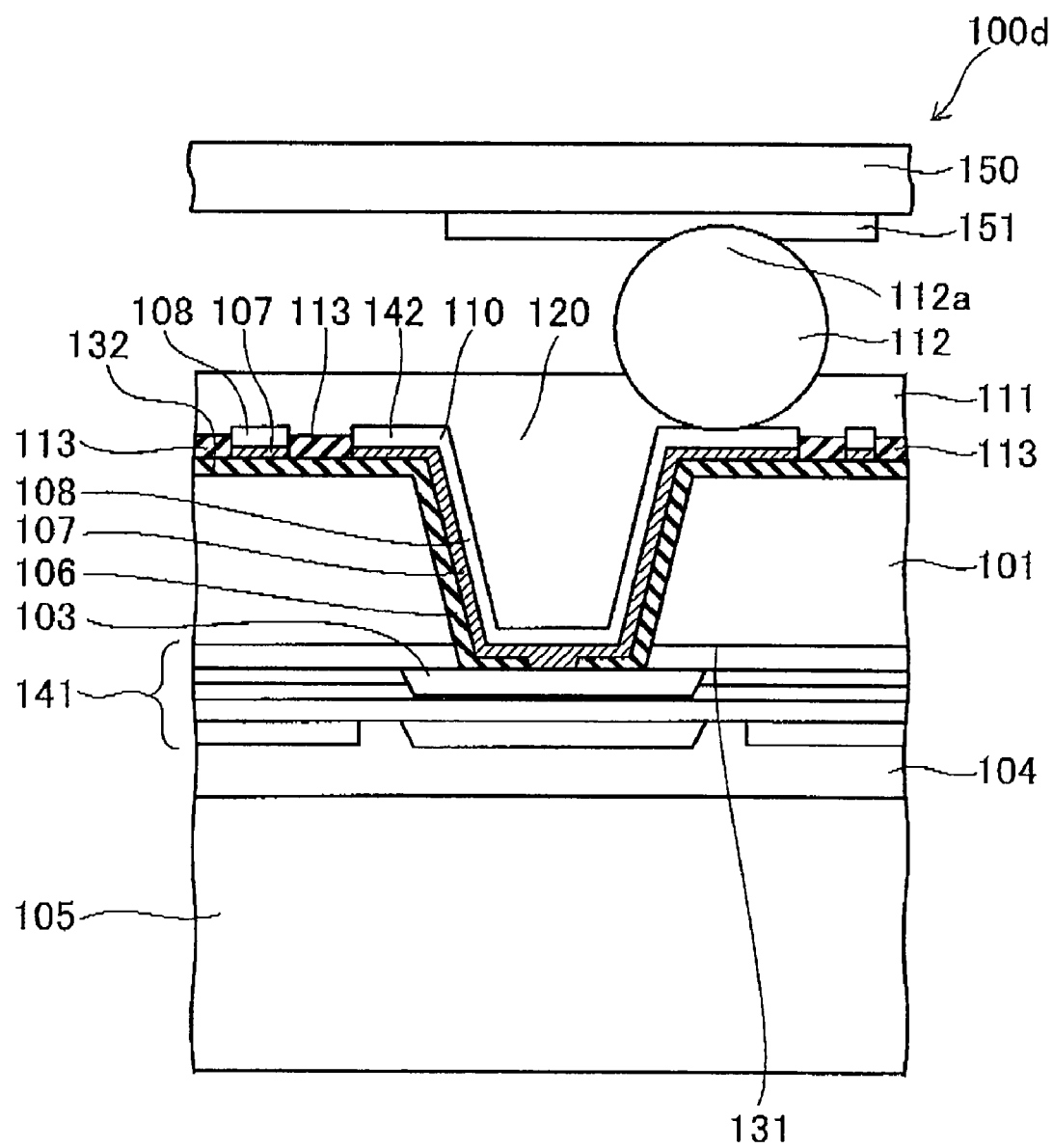
FIG. 13 is a cross-sectional schematic view showing the structure of a solid state imaging device of a fifth example of the invention.

The solid state imaging device of the fifth example has a structure shown in FIG. 13. More specifically, a backside interconnect electrode 142 is placed on the backside 132 of the imaging device substrate 101, a light shielding layer 113 is self aligned with the backside interconnect electrode 142, and a solder resist 111 is provided thereon. The fifth example can be fabricated as follows.

Figure 14:
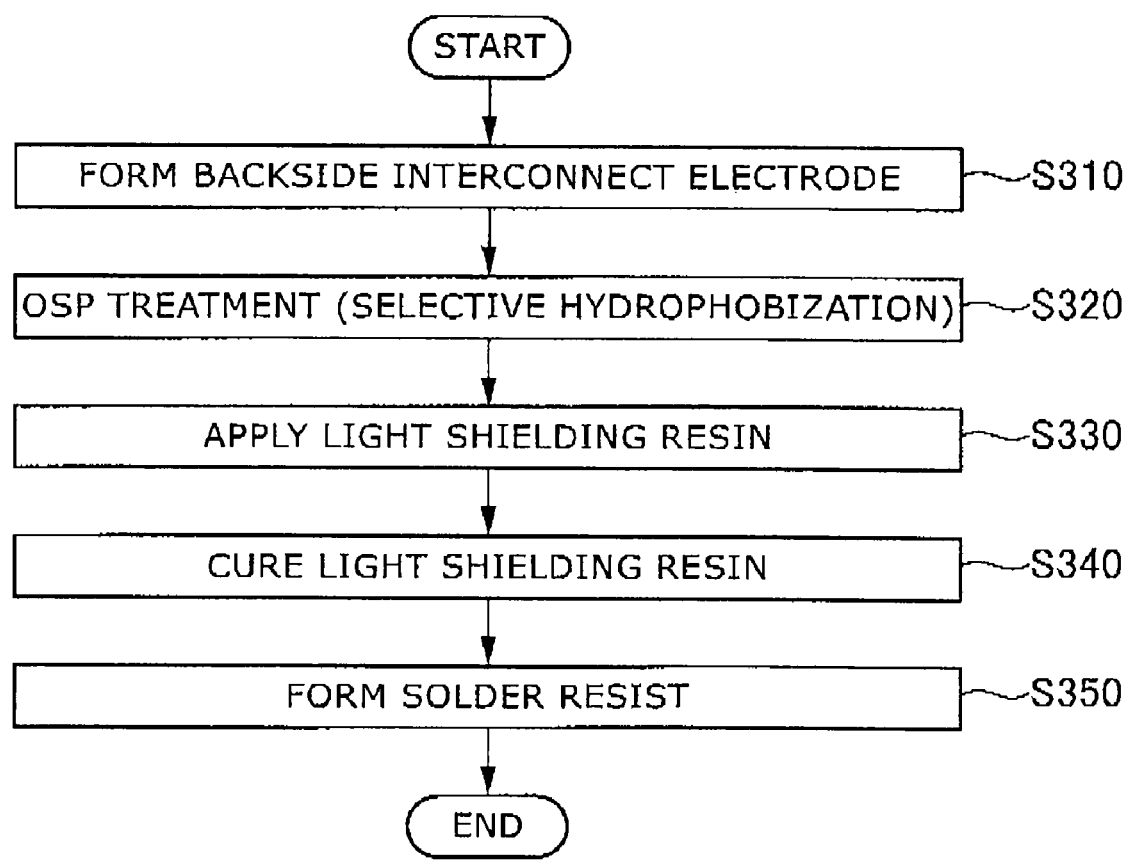
FIG. 14 is a flow chart illustrating a method for manufacturing a solid state imaging device of the fifth example of the invention.

FIGS. 14 and 15 are a flow chart and a process cross-sectional view illustrating a method for manufacturing a solid state imaging device of the fifth example of the invention.

Figure 15A:
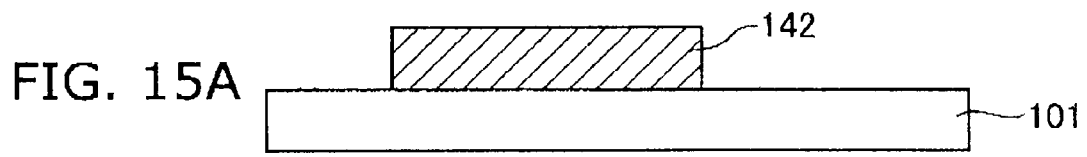
FIGS. 15A to 15E are process cross-sectional views illustrating a method for manufacturing a solid state imaging device of the fifth example of the invention.

As shown in FIG. 14, first, a backside interconnect electrode 142 is formed in S310 (see FIG. 15A, where the other members are not shown). In this step, for example, the method described above with reference to FIGS. 4A to 4F, 5A, and 5B can be used.

Figure 15B:
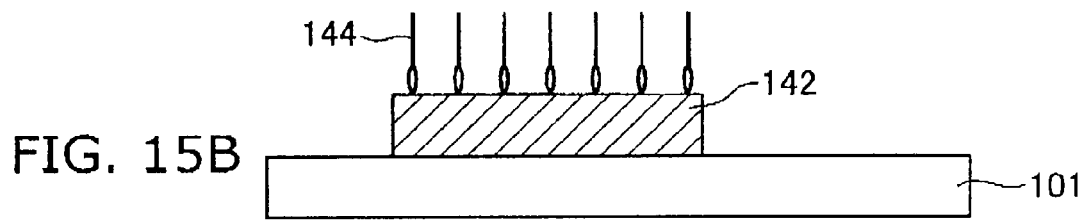

Next, in S320, the OSP treatment is performed as a surface treatment (see FIG. 15B). More specifically, the imaging device substrate 101 is immersed in an OSP solution containing an imidazole compound, Cu ions, and an organic acid, and washed. Thus, an organic coating 144 is formed only on the surface of the Cu film 108 (backside interconnect electrode 142) on the backside 132 of the imaging device substrate 101 (see FIG. 15B). That is, an organic coating 144 is formed only on the surface portion of the Cu film 108. This realizes a surface treatment for selectively hydrophobizing only the surface of the Cu film 108 (backside interconnect electrode 142). It is noted that the OSP is not limited to the above example, but can be suitably selected depending on the surface property of the material (and the other portion) constituting the surface of the backside interconnect electrode 142.

Figure 15C:
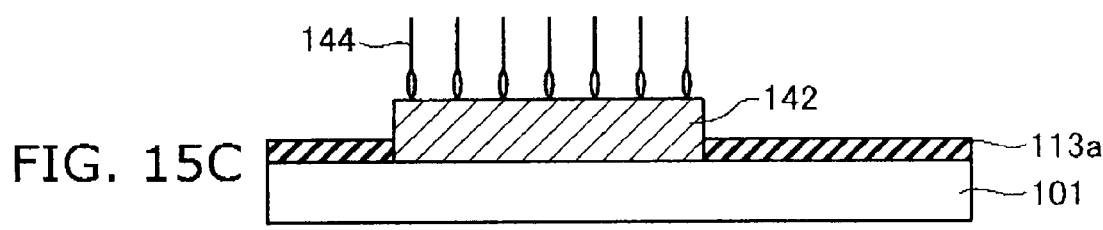
Figure 15D:
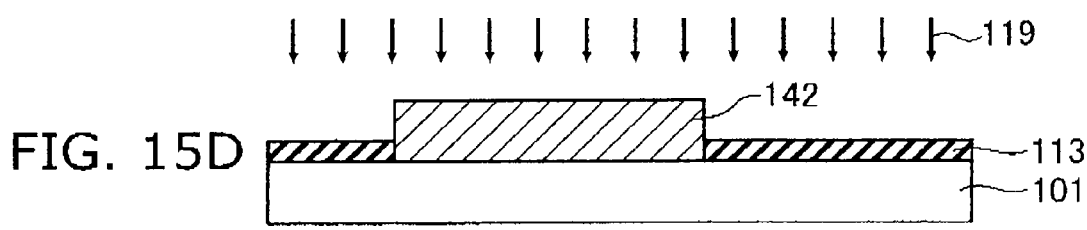
Figure 15E:
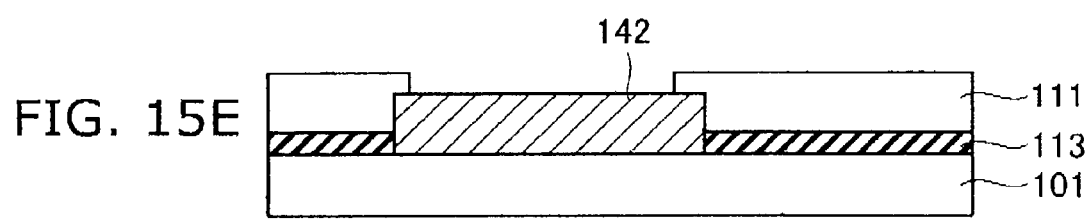

Next, in S330, a light shielding resin 113a is applied (FIG. 15C). Here, because the surface of the Cu film 108 (backside interconnect electrode 142) is hydrophobized, the light shielding resin 113a is repelled and not attached thereto, but attached only to the other portion. Thus, the light shielding layer 113 is formed in self-alignment with the backside interconnect electrode 142. That is, the light shielding layer 113 is provided coplanar with and adjacent to the backside interconnect electrode 142 without any substantial gap. Because the organic coating 144 is formed not only on the upper surface of the Cu film 108 (backside interconnect electrode 142), but also on its side surface, the light shielding resin 113a is attached to the surface of the Cu film 108 (backside interconnect electrode 142) excluding its upper and side surface. Hence, although the light shielding resin 113a is not in close contact with the side surface of the Cu film 108 (backside interconnect electrode 142), it is formed adjacent to the Cu film 108 (backside interconnect electrode 142) without any substantial gap. In FIGS. 15C to 15E, for convenience, the light shielding resin 113a and the light shielding layer 113 are shown in contact with the backside interconnect electrode 142, but in practice, as described above, they are not in contact with the backside interconnect electrode 142. However, the gap between the light shielding layer 113 and the backside interconnect electrode 142 is very small, and the backside incident light can be sufficiently shielded.

Next, in S340, the light shielding resin 113a is cured. For example, in the case where the light shielding resin 113a is ultraviolet curable, the light shielding resin 113a is cured by irradiation with ultraviolet light 119 to form a light shielding layer 113 (see FIG. 15D). After ultraviolet irradiation, heat curing can be additionally performed. In the case where the light shielding resin 113a is heat curable, such as polyimide resin, rather than ultraviolet curable, then heating is performed instead of irradiation with ultraviolet light 119. Thus, a light shielding layer 113 can be selectively provided on the portion excluding the Cu film 108 (backside interconnect electrode 142).

Subsequently, the backside 132 of the imaging device substrate 101 can be irradiated with ultraviolet light to hydrophilize the surface of the Cu film 108 (ball opening 114), which was once hydrophobized. That is, ultraviolet light can be used to remove the organic coating 144 or deactivate the hydrophobization effect of the organic coating 144. This facilitates the subsequent step of forming the solder resist 111 and placing the solder ball 112, for example, and further ensures electrical connection between the Cu film 108 and the solder ball 112. In the foregoing, in the case where the light shielding layer is made of a photosensitive resin, the organic coating 144 for hydrophobization can be hydrophilized by ultraviolet irradiation for curing the light shielding resin, and the number of process steps can be reduced. Besides ultraviolet irradiation, the above hydrophilization of the organic coating 144 can be also realized illustratively by plasma ashing.

Next, in S350, a solder resist 111 is formed excluding the ball opening 114 (see FIG. 15E). In this step, the method described with reference to FIG. 5C can be illustratively used.

Subsequently, the solid state imaging device 100d shown in FIG. 13 can be fabricated in a similar method to the first example.

In the solid state imaging device 100d thus obtained, the light shielding layer 113 can be easily and selectively provided on the backside of the imaging device substrate 101. Thus, a small-sized solid state imaging device having a backside electrode structure and allowing uniform display can be provided at low cost.

Sixth Example

Next, a sixth example is described.

Figure 16A:
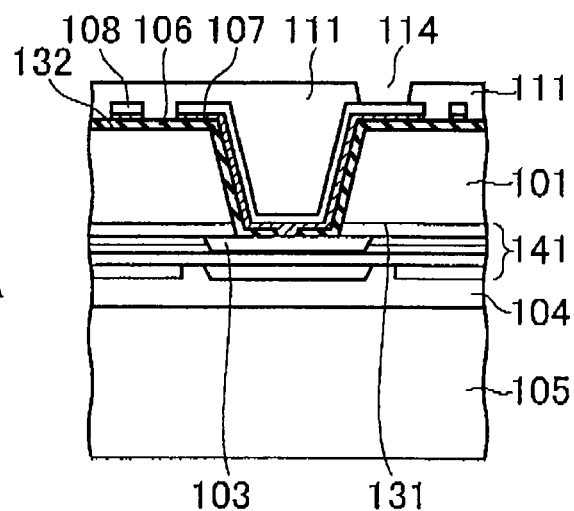
FIGS. 16A to 16C are cross-sectional schematic views in each step of manufacturing the solid state imaging device of a sixth example of the invention.
Figure 16B:
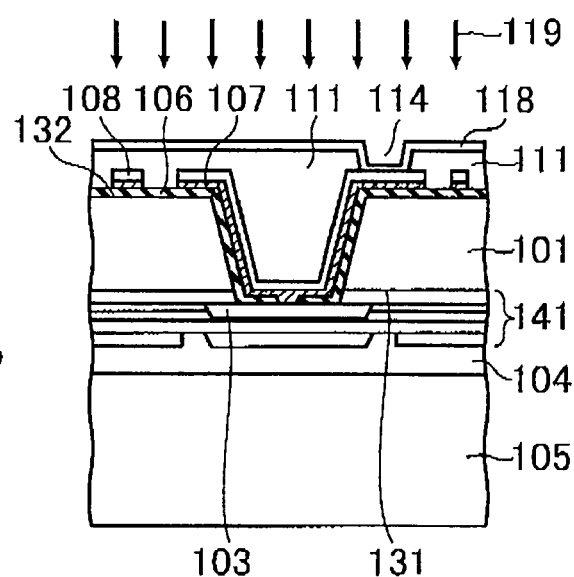
Figure 16C:
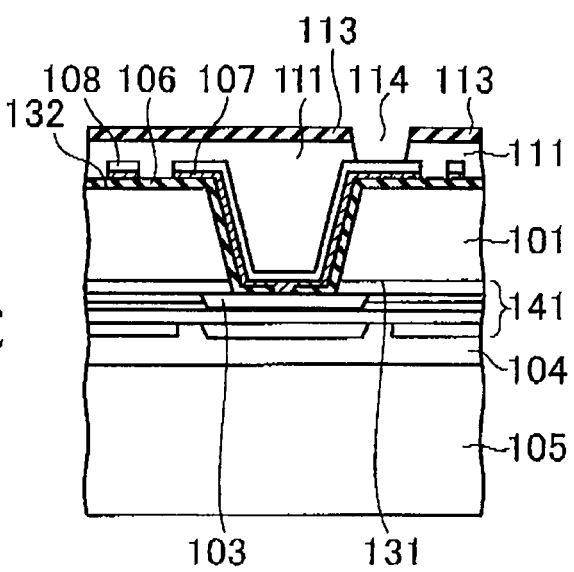

FIGS. 16A to 16C are cross-sectional schematic views in each step of manufacturing the solid state imaging device of the sixth example.

In the sixth example, the steps until providing a solder resist 111 are the same as those of the first example shown in FIGS. 4A to 4F, and 5A to 5C.

In the sixth example, after the solder resist 111 is formed (see FIG. 16A), as shown in FIG. 16B, a surface modification layer 118 is provided on the solder resist 111. Then, toward the backside 132, the surface modification layer 118 is irradiated with ultraviolet light 119 through a mask having a prescribed pattern to perform surface treatment for hydrophobizing the ball opening 114. That is, a surface modification layer 118 capable of selectively providing a hydrophobic surface depending on ultraviolet irradiation is provided on the backside 132 of the imaging device substrate 101. Thus, a surface treatment for selectively hydrophobizing the surface is performed. The above surface modification layer 118 can illustratively be a photosensitive organic thin film layer including a long-chain alkyl group or a fluorine group.

Subsequently, as shown in FIG. 16C, a light shielding resin illustratively made of polyimide resin containing carbon particles is applied onto the solder resist 111. Then, the ball opening 114 repels the light shielding resin because of low wettability, and the portion other than the ball opening 114 is coated with the light shielding resin because of high wettability. Thus, a light shielding resin can be selectively provided on the portion excluding the ball opening 114. Subsequently, the light shielding resin is baked to form a light shielding layer 113. After the light shielding layer 113 is provided, the surface modification layer 118 can be substantially removed by ultraviolet irradiation or plasma ashing of the backside 132.

Subsequently, the solid state imaging device is fabricated in a similar method to the first example.

In the solid state imaging device thus obtained, the light shielding layer 113 can be easily and selectively provided on the backside of the imaging device substrate 101. Thus, a small-sized solid state imaging device having a backside electrode structure and allowing uniform display can be provided at low cost.

The solid state imaging device illustrated in the above embodiment of the invention has a structure in which the frontside interconnect electrode electrically connected to the imaging device section is connected to the backside interconnect electrode through a penetrating electrode. However, the invention is not limited thereto, but whatever structure can be used as long as the imaging device section is electrically connected to the backside interconnect electrode.

The embodiment of the invention has been described with reference to examples. However, the invention is not limited to these examples. For instance, the specific dimensions and materials of the elements constituting the solid state imaging device and the method for manufacturing the same, and the solid state imaging module, can be suitably selected from known techniques by those skilled in the art, and modifications based on such selections are also encompassed within the scope of the invention as long as they can similarly embody the invention and achieve similar effects.

Any two or more elements in the above examples can be combined as long as technically feasible, and such combinations are also encompassed within the scope of the invention as long as they fall within the spirit of the invention.

The solid state imaging device and the method for manufacturing the same, and the solid state imaging module, described above as the embodiment of the invention can be suitably modified and practiced by those skilled in the art, and all such modifications are also encompassed within the scope of the invention as long as they fall within the spirit of the invention.

It is understood that various other variations and modifications that could be contemplated by those skilled in the art within the spirit of the invention are also encompassed within the scope of the invention.

The invention claimed is:

1. A solid state imaging device comprising:
   an imaging device substrate with an imaging device section formed on a first major surface side thereof;
   a backside interconnect electrode provided on a second major surface side of the imaging device substrate and electrically connected to the imaging device section, the second major surface being on the opposite side of the first major surface;
   a circuit substrate provided with a circuit substrate electrode opposed to the second major surface;
   a connecting portion electrically connecting the backside interconnect electrode to the circuit substrate electrode; and
   a light shielding layer provided on the circuit substrate side of the backside interconnect electrode and configured to shield light passing though a gap between the imaging device substrate and the circuit substrate.

2. The solid state imaging device according to claim 1, wherein the light shielding layer is made of a resin dispersed with at least one selected from carbon particles, inorganic pigment particles, organic pigment particles, and mixtures thereof.

3. The solid state imaging device according to claim 1, wherein the light shielding layer is a film made of a metal and a metal compound.

4. The solid state imaging device according to claim 1, wherein the light shielding layer contains at least one selected from the group consisting of titanium, titanium nitride, and an aluminum-copper alloy.

5. The solid state imaging device according to claim 1, wherein transmittance of the light shielding layer for wavelengths from 820 to 1170 nm is 10% or less.

6. The solid state Imaging device according to claim 1, wherein transmittance of the light shielding layer for wavelengths from 820 to 1170 nm is 3% or less.

7. The solid state Imaging device according to claim 1, wherein the light shielding layer exposes at least part of the connecting portion.

8. The solid state imaging device according to claim 1, wherein the light shielding layer is insulative and in contact with at least one of the backside interconnect electrode and the connecting portion.

9. The solid state imaging device according to claim 1, wherein the light shielding layer is spaced from the backside interconnect electrode and the connecting portion, or provided thereabove via an insulating layer.

10. The solid state imaging device according to claim 1, wherein the light shielding layer is self aligned with the backside interconnect electrode.

11. A solid state imaging module comprising:
    a solid state imaging device including
        an imaging device substrate with an imaging device section formed on a first major surface side thereof,
        a backside interconnect electrode provided on a second major surface side of the imaging device substrate and electrically connected to the imaging device section, the second major surface being on the opposite side of the first major surface,
        a circuit substrate provided with a circuit substrate electrode opposed to the second major surface,
        a connecting portion electrically connecting the backside interconnect electrode to the circuit substrate electrode, and
        a light shielding layer provided on the circuit substrate side of the backside interconnect electrode and configured to shield light passing though a gap between the imaging device substrate and the circuit substrate;
    a lens provided on the first major surface side of the solid state imaging device and opposed to the imaging device section; and
    a supporting component holding the lens and fixing the lens to the solid state imaging device.

12. The solid state imaging module according to claim 11, wherein a gap allowing transmission of light is provided at least in part between the supporting component and the circuit substrate.

13. A solid state imaging device comprising:
an imaging device substrate with an imaging device section formed on a first major surface side thereof;
a backside interconnect electrode provided on a second major surface side of the imaging device substrate and electrically connected to the imaging device section, the second major surface being on the opposite side of the first major surface;
a circuit substrate provided with a circuit substrate electrode opposed to the second major surface;
a connecting portion electrically connecting the backside interconnect electrode to the circuit substrate electrode; and
a light shielding layer provided coplanar with the backside interconnect electrode and configured to shield light passing though a gap between the imaging device substrate and the circuit substrate.

14. The solid state imaging device according to claim 13, wherein the light shielding layer is made of a resin dispersed with at least one selected from carbon particles, inorganic pigment particles, organic pigment particles, and mixtures thereof.

15. The solid state imaging device according to claim 13, wherein the light shielding layer is a film made of a metal and a metal compound.

16. The solid state imaging device according to claim 13, wherein the light shielding layer contains at least one selected from the group consisting of titanium, titanium nitride, and an aluminum-copper alloy.

17. The solid state imaging device according to claim 13, wherein transmittance of the light shielding layer for wavelengths from 820 to 1170 nm is 10% or less.

18. The solid state imaging device according to claim 13, wherein transmittance of the light shielding layer for wavelengths from 820 to 1170 nm is 3% or less.

19. The solid state imaging device according to claim 13, wherein the light shielding layer exposes at least part of the connecting portion.

20. The solid state imaging device according to claim 13, wherein the light shielding layer is insulative and in contact with at least one of the backside interconnect electrode and the connecting portion.

21. The solid state imaging device according to claim 13, wherein the light shielding layer is spaced from the backside interconnect electrode and the connecting portion, or provided thereabove via an insulating layer.

22. The solid state imaging device according to claim 13, wherein the light shielding layer is self aligned with the backside interconnect electrode.

23. The solid state imaging device according to claim 13, wherein the light shielding layer is further provided on the circuit substrate side of the backside interconnect electrode.

24. A solid state imaging module comprising:
a solid state imaging device including
an imaging device substrate with an imaging device section formed on a first major surface side thereof,
a backside interconnect electrode provided on a second major surface side of the imaging device substrate and electrically connected to the imaging device section, the second major surface being on the opposite side of the first major surface,
a circuit substrate provided with a circuit substrate electrode opposed to the second major surface,
a connecting portion electrically connecting the backside interconnect electrode to the circuit substrate electrode, and
a light shielding layer provided coplanar with the backside interconnect electrode and configured to shield light passing though a gap between the imaging device substrate and the circuit substrate;
a lens provided on the first major surface side of the solid state imaging device and opposed to the imaging device section; and
a supporting component holding the lens and fixing the lens to the solid state imaging device.

25. The solid state imaging module according to claim 24, wherein a gap allowing transmission of light is provided at least in part between the supporting component and the circuit substrate.

26. The solid state imaging device according to claim 24, wherein the light shielding layer is further provided on the circuit substrate side of the backside interconnect electrode.

* * * * *